United States Patent [19]

Raimi

[11] Patent Number: 5,604,895
[45] Date of Patent: Feb. 18, 1997

[54] METHOD AND APPARATUS FOR INSERTING COMPUTER CODE INTO A HIGH LEVEL LANGUAGE (HLL) SOFTWARE MODEL OF AN ELECTRICAL CIRCUIT TO MONITOR TEST COVERAGE OF THE SOFTWARE MODEL WHEN EXPOSED TO TEST INPUTS

[75] Inventor: Richard S. Raimi, Austin, Tex.

[73] Assignee: Motorola Inc., Schaumburg, Ill.

[21] Appl. No.: 536,420

[22] Filed: Sep. 29, 1995

Related U.S. Application Data

[63] Continuation of Ser. No. 199,433, Feb. 22, 1994, abandoned.
[51] Int. Cl.$^6$ .............................. G06F 11/30; G06F 17/50
[52] U.S. Cl. ................... 395/500; 395/701; 395/183.13; 395/704; 364/578
[58] Field of Search ...................... 395/500, 650, 395/700, 183.13, 183.11; 364/488, 489, 578

[56] References Cited

U.S. PATENT DOCUMENTS

| | | | |
|---|---|---|---|
| 4,763,289 | 8/1988 | Barzilai et al. ........................ | 364/578 |
| 4,794,522 | 12/1988 | Simpson ................................. | 395/500 |
| 4,924,429 | 5/1990 | Kurashita et al. ...................... | 364/578 |
| 5,050,168 | 9/1991 | Paterson ................................. | 395/375 |
| 5,105,374 | 4/1992 | Yoshida ................................. | 364/578 |
| 5,204,956 | 4/1993 | Danuser et al. ..................... | 395/184.01 |
| 5,265,254 | 11/1993 | Blasciak et al. ....................... | 395/700 |
| 5,274,815 | 12/1993 | Trissel et al. .......................... | 395/700 |
| 5,313,616 | 5/1994 | Cline et al. ............................ | 395/500 |
| 5,335,344 | 8/1994 | Hastings ............................ | 395/183.11 |
| 5,347,647 | 9/1994 | Allt et al. ............................ | 395/183.04 |
| 5,544,067 | 8/1996 | Rostoker et al. ...................... | 364/489 |

*Primary Examiner*—Parshotam S. Lall
*Assistant Examiner*—Viet Vu

[57] ABSTRACT

A method and apparatus, for determining test coverage estimation for an electrical circuit (10) formed in accordance with an original high level description (21), uses a central processing unit (CPU 18). The CPU (18) accesses the description (21) and parses the high level language description (21) to allow for the generation of new code. This new code is intermixed with code from the description (21) to form a new high level description (22) which not only can be used to simulate the electrical circuit but can collect test coverage information. A simulation of the description (22) is performed using test vector inputs to simulate operation of the circuit (10) and estimate it's test coverage for the test vectors. Various warning/error messages are derived to indicate where the test vectors are lacking in test coverage.

36 Claims, 5 Drawing Sheets

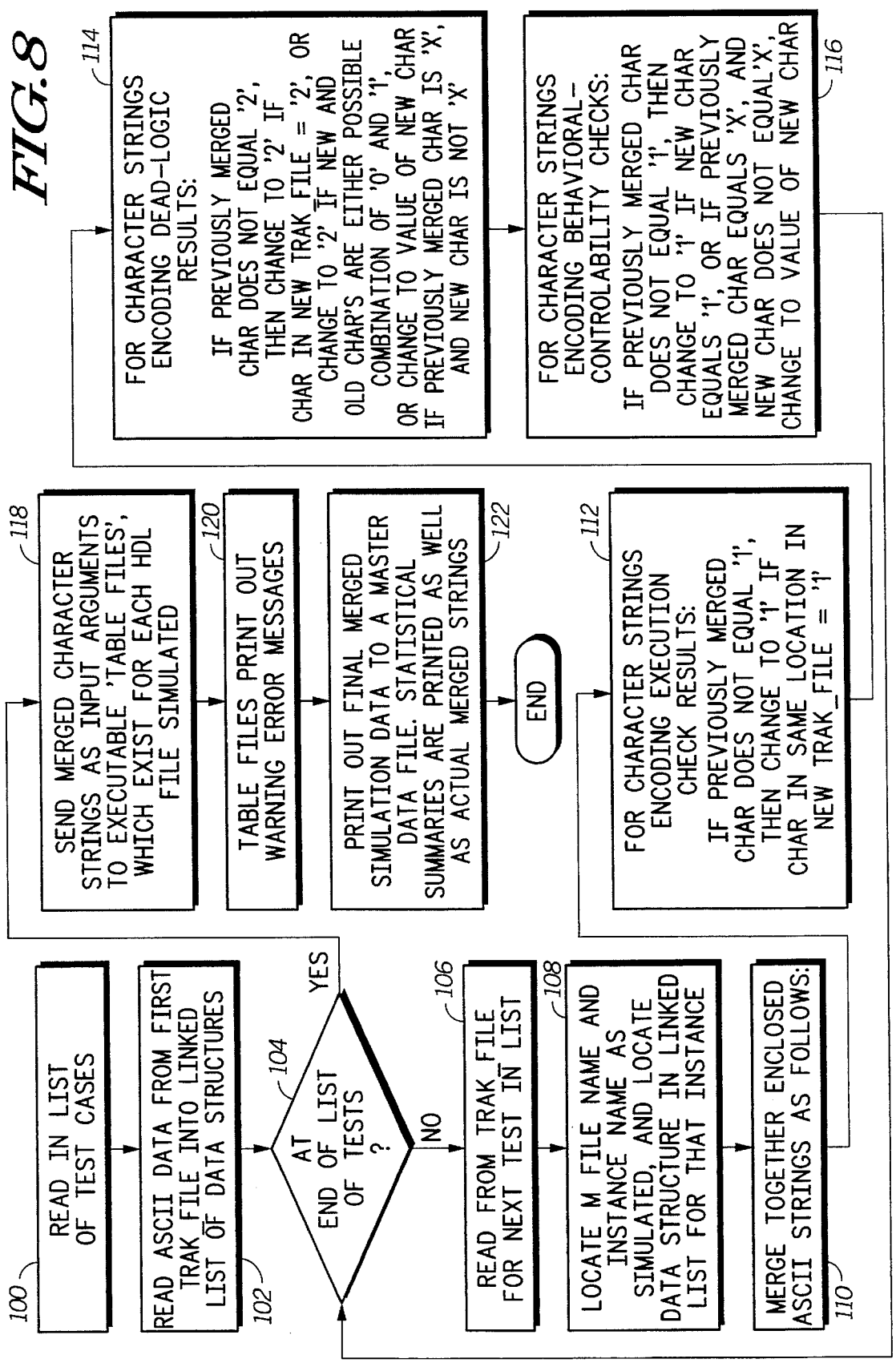

METHOD AND APPARATUS FOR INSERTING COMPUTER CODE INTO A HIGH LEVEL LANGUAGE (HLL) SOFTWARE MODEL OF AN ELECTRICAL CIRCUIT TO MONITOR TEST COVERAGE OF THE SOFTWARE MODEL WHEN EXPOSED TO TEST INPUTS

This application is a continuation of prior application Ser. No. 08/199,433, filed on Feb. 22, 1994, entitled "A METHOD AND APPARATUS FOR PROVIDING TEST COVERAGE ESTIMATION FOR AN ELECTRICAL CIRCUIT", abandoned.

FIELD OF THE INVENTION

The present invention relates generally to data processing systems, and more particularly, to estimating the test coverage of an electrical circuit given a plurality of test inputs.

BACKGROUND OF THE INVENTION

In the art, there are three systems to which the present invention can be compared: (1) IBM's Test Coverage Estimation tool; (2) Verilog's profiling capacity; and (3) general prior art profiling techniques in use for software testing.

In the below discussion, the term 'profiling' will be used to designate the practice of surrounding existing computer code of a high-level language program (such as a C program or PASCAL program) with what we have previously termed 'monitor code'. In other words, profiling is synonymous with what we have defined 'instrumenting' or 'instrumentation' to be in the text below.

IBM has developed a software tool for estimating test coverage during simulation. However, their tool does not have the ability to parse through the model being simulated and to search out logic expressions that need to be satisfied for 'completeness'. The IBM tool cannot be used to determine if desired combinations of logic values have occurred on predetermined circuit nodes during simulation. Furthermore, the IBM tool does not have a model for fault test controllability, and cannot perform the checks for fault-controllability. Nor does it have a model for functional test completeness or reduction of test vectors to reduce testing clock cycles and maximize test coverage. The IBM test coverage estimation tool is limited to checking for execution of certain lines of code during a simulation, and for the 'toggling' of certain assignment variables (i.e., checking if those variables were put in both the true and false logic states during a simulation). The IBM tool does not go beyond this capability, to the generation of code for automatic checking of the satisfaction of logic expressions pertinent to fault-controllability. The IBM test tool also cannot be used to check for functional test completeness.

Verilog simulators have the ability to output information as to line execution rates; however, they have no ability to output information on toggling of variables, nor about combinations of circuit nodes asserted, nor about sequences of circuit combinations asserted. Also, a Verilog simulator is used only if one uses Verilog as the hardware description language (hereafter HDL). A Verilog simulator cannot take any HDL as input and, with appropriate adaptation, make that HDL work in concert with any simulator.

General profiling techniques are used for software for code instrumentation (i.e., generation of additional code to check for the occurrence of various events) is used. However, the types of checks made by a software profiling package are different from the tests, hardware, and algorithms needed to perform test coverage estimation. Mostly, software profilers tabulate line execution rates, and check to make sure the code takes both the true and false branches through conditional clauses (e.g. an if-then-else construct).

SUMMARY OF THE INVENTION

The previously mentioned disadvantages are overcome and other advantages achieved with the present invention. In one form, the present invention comprises a method for estimating test coverage of an original high level language description of a circuit. The original high level language description has at least one executable assignment statement which models the circuit. The at least one executable assignment statement has a left side and a right side separated by an assignment operator. The left side is subject to assignment in response to both a set of variables from the right side, the set having at least one variable and at least one logic operator from the right side. The method begins by parsing the original high level language description having at least one executable assignment statement to obtain information. A new high level language description, which includes new code generated in response to the information and the code of the original high level language description, is generated. The new code is generated to store data which indicates whether, during the execution of the new high level language description of the circuit, the set of variables from the right side have been set to predetermined combinations of values.

In another form, the invention comprises a data processor for determining the test coverage of an electrical circuit. The data processor has a memory unit containing an original high level description which models the electrical circuit via a plurality of assignment statements. Each assignment statement has a left side and a right side wherein the left side and right side are separated by an assignment operator. The right side containing at least one variable. A bus is coupled to the memory unit. A central processing unit (CPU) is coupled to the bus to allow communication between the CPU and the memory unit. The CPU reads the original high level language description from the memory unit and creates a new high level language description. The new high level language description contains the plurality of assignment statements and a plurality of new assignment statements inserted among the plurality of assignment statements to store, in an output file in the memory unit upon simulation of the new high level language description using input data, (1) whether the at least one variable on the right side of each assignment statement in the plurality of assignment statements has been set to a plurality of predetermined values; (2) whether the left side of each assignment statements in the plurality of assignment statements has been set to a predetermined set of values; and (3) whether each of the assignment statements in the plurality of assignments statements has been executed, the output file being used by the CPU to create a test coverage information file which is stored in the memory unit.

The present invention will be more clearly understood from the detailed description below in conjunction with the accompanying drawings.

BRIEF DESCRIPTION OF THE DRAWINGS

FIG. 8 illustrates, in a flowchart, a flow for merging multiple ASCII output files from multiple simulations in accordance with the present invention.

Figure 1:
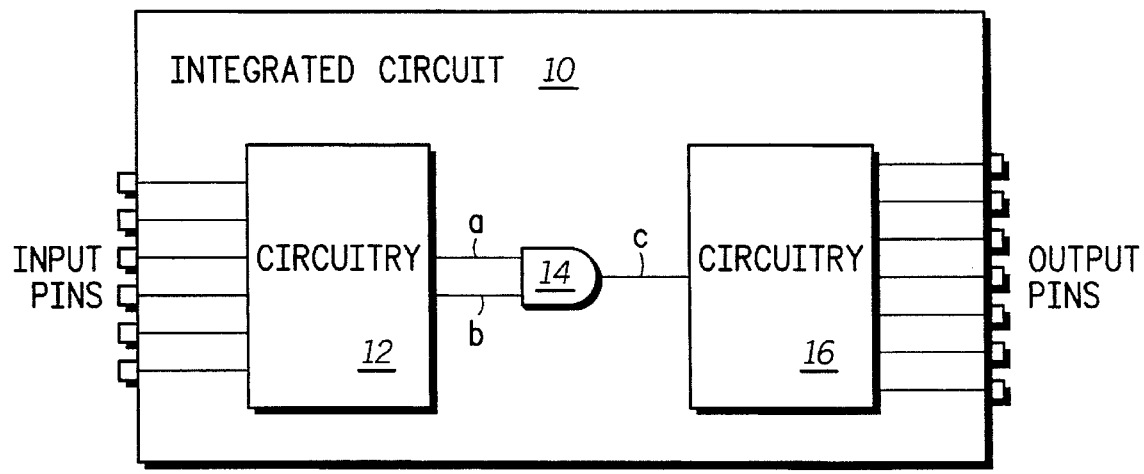
FIG. 1 illustrates, in a block diagram, a circuit which can have test coverage estimation performed in accordance with the present invention.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF THE PREFERRED EMBODIMENT

Generally, the present invention, herein called 'flt', provides a method and data processor to estimate the simulation test coverage which a suite of simulation input programs provides for a given HDL model of an electrical circuit.

The 'flt' process improved on the techniques mentioned in the Background of the Invention by introducing models of test coverage completeness, and building in the capability of code generation to track the complicated logic expressions needed for such modeling. Specifically, as presently implemented, 'flt' has a model for completeness of fault-controllability coverage, and is able to generate code, based on the logic expressions it finds within the original HDL file, to estimate the extent to which a series of test cases controls the faults in the modeled circuit.

'flt' differs from other test coverage estimation methods primarily in the ability to recognize, and understand, logic operations modeled in the HDL input file, and the ability to generate code capable of checking whether various entries in the truth tables of those logic operators have been satisfied. In other words, the 'flt' program is used to estimate if a set of inputs to a digital circuit are cycled through all necessary combination of inputs in order to thoroughly test the digital circuit.

Definitions of terms and terminology used to describe the 'flt' program appear in this section.

A model of a circuit design is customarily written in a special type of high-level programming languages called an HDL (hardware description language). HDLs differ from other high level programming languages in the availability of specialized data types and semantic constructs for describing electrical hardware and its connectivity. Each HDL usually has a simulator associated with it, so that the circuit description can be executed within the simulation program. The 'flt' invention "instruments" an HDL file, i.e., it adds new code to the existing code of an HDL (or other high level language) description of an electrical circuit, for the purpose of monitoring various simulation events of interest when the file is simulated. The new code which 'flt' adds consists of conditional assignments to specially created variables, each of which monitors a given simulation event. Some specific types of simulation events which 'flt' monitors in this manner are documented in this text. When executed in a simulator, a 'flt'-generated file will output data which can be used to ascertain the extent to which the test patterns applied to the simulator covered certain events of interest in an electrical circuit (or more particularly an integrated circuit). In general, 'flt' provides a manner to estimate simulation test coverage. The test coverage estimation is done by applying a set of test vectors/patterns to an HDL circuit model and using the 'flt' program to determine the completeness of the testing. This test completeness will closely approximate the test completeness of the test vectors/patterns when applied to a real integrated circuit or electrical circuit formed in accordance with the HDL circuit model.

The methods of 'flt' are not restricted to use only on languages which are commonly termed HDLs; these are only its most likely applications. If an electrical circuit description were to be written in a regular high level programming language, such as C, the methods of 'flt' would be applicable in that case as well.

The invention described herein provides a means of effecting many valuable functions, including fault coverage estimation, state machine testing, quiescent node checking, test vector reduction, simulation cycle time reduction, full truth table evaluation, and others, all of which will be fully explained in this document.

Simulators, as presently used in industry, are a primary means of verifying the correctness of modern circuits, i.e., of verifying that there are no design flaws in the circuit model. In addition, simulator output is used to obtain input/output sequences against which manufactured parts are 'fault' tested, a fault test being one that tries to find manufacturing defects of a circuit, as opposed to design flaws of the circuit. However, despite being a key tool in the verification and fault testing of modern chip designs, simulators, in general, have rather poor methods of monitoring specific simulation events, and usually have no means at all of pooling information about accumulations of events. For this reason it is difficult or impossible to know whether a given set of simulation test cases exercise/test the circuit model in the way the user would desire. In other words, it would be advantageous to determine that when providing a first set of test patterns to a circuit, 80% of the circuit is tested adequately and that when providing a second set of test patterns to a circuit, 60% of the circuit is tested adequately (for example). Such information is critically important for correctly determining if all needed cases have been simulated.

'flt' was developed to meet this need. Furthermore, every test vector within the (for example) first set of test patterns takes time (clock cycles) to execute. If redundant test vectors (test vectors which test nothing new over and above other test vectors in the first set of test patterns) are removed by 'flt' then testing time may be reduced without compromising the test coverage percentage. Furthermore, areas which lack test coverage can be directly and specifically identified so that engineers may generate new test vectors to increase coverage in a faster manner than the prior art. In general, when executed, 'flt' can analyze the extent of test coverage a given set of simulation test cases provide for a given circuit model.

When reading this document, several definitions are required in order to improve understanding. Throughout this document, the word code will refer to expressions and statements in a high-level programming language. And, the abbreviation 'HDL' will stand for a hardware description language, as stated above, which is a particular type of high level programming language having specialized data types and semantic constructs for describing electrical hardware and its connectivity (although other computer programming languages may be substituted for an HDL). The word 'instruments' or 'instrumentation' will refer to the practice of augmenting existing code by surrounding it with monitor code, where monitor code refers to new or generated code which records the execution of various simulation events of interest. The word model or circuit model, unless used clearly in another context, will refer to any high-level programming language description of an electrical circuit, which could be an HDL file, or group of HDL files, or, in the event that a 'regular' programming language such as C, Pascal, etc., is used, any file or files in those languages which models electrical circuitry. The words Boolean data type will refer to variables which take on 'true' or 'false' logic values (logic one or logic zero), or, in what will be assumed to be equivalent language, 'high' or 'low' logic values. Implementation details for Boolean data types will vary among different languages.

Some terms related to high-level programming languages, among which are HDLs, need to be defined. An assignment statement is any statement allowed by a high level language that has an assignment operator (such as one or more of =, =&, <<, =+, and the like), an expression to be evaluated (a right hand [B] side of A=B for example), and symbols for one or more variables that are to be updated with new values (a left hand [A] side of A=B), the new values being those obtained from evaluating the expression on the right-hand side [B]. An example of an expression is x=y&b&c|d, x=& e, or z=(a|b)&c. Hereafter, we shall refer to the expression to be evaluated as the 'right-hand side', 'right-side', or 'rvalue' of the assignment statement, and the variable or set of variables to be updated with new values as the 'left-hand side', 'left side' or 'lvalue' of the assignment statement, since these elements most commonly appear on the right and left sides, respectively, of an assignment operator in most high-level programming languages. The assignment operator is a symbol which dictates how the assignment is to effected.

A simulator will be deemed to be any data processing system which can take a description of an electrical circuit, as opposed to an actual hardware implementation, and simulate the digital behavior of that circuit, 'digital behavior' referring to the logic values associated with circuit nodes, in the common meanings of the term 'logic values' in the industry, which are that various voltage levels correspond to 'high' or 'low' or 'true' or 'false' logic values. A 'test', 'test pattern', 'test vector', or 'test case', in the context of simulation, is an input pattern (plurality of binary values) which the user of the simulator supplies and which the simulation program then applies to the circuit model to manipulate the logic of the circuit model. And an input pattern, in this context, refers to a designation of particular logic values to be applied to particular circuit inputs at particular cycles of the simulation. A simulator generally implements a concept of 'cycles', which the user is free to interpret as phases of a synchronous clock signal that might be implemented in the electrical circuit; inside the simulator itself, however, a cycle is generally considered to be a single pass through the model of the circuit being simulated, during which time circuit node values are determined based on user specified input patterns.

A high-level programming language, or, as it will be termed here simply a high-level language, will be defined herein as a language for giving commands to a data processing system, or computer, or central processing unit (CPU) such that the language resembles a natural language, such as English.

Assignment statements in a high level language can, and often do, contain 'logic', or 'logical' operators. These are symbols which designate the performing of logic operations, such as AND, OR, XOR, etc., which are then carried out in the CPU when the high level language program is executed. For example, the expression 'a&b' could symbolize, in some high level language, the logical AND of the values stored in the variables 'a' and 'b'. A variable in a high level language is a symbolic name, given generally by the user or writer of a high level language program, which name is then used as a label for values stored in some given memory location. These values can be changed by the execution of the program. In general, variables have associated with them certain data types, by which is meant that the values stored in memory can be used in certain predefined ways, depending on the data type of the variable associated with the value. For example, values associated with variables declared as integers in a program will be used in different types of operations than, say, variables declared as real numbers. A 'declaration' of a variable is a means by which the variable symbol may be associated with the particular data type desired by the writer of a program (a program being a set of legal expressions of a particular high level programming language).

'Parsing' of a file written in a particular language is the act of grouping together symbols found in that file in such a manner as to recognize various categories of legal expression of the language. The systematic recognition of legal expressions of a language is synonymous with recognition of patterns of expressions which obey the grammatical rules of that language. Parsing, then, can be viewed as testing strings of symbols for satisfaction of one or another grammatical rule of a language, specifically a computer language.

'Test coverage estimation' is construed in this document to be a process whereby an estimate is made of the extent to which a set of simulation test cases covers a set of predetermined simulation events of interest. The estimate could be in the form of a percentage, or in the form of an absolute number of numbers. For example "15% of events X were covered", or "45 out of 60 of events of such and such were covered", or "13 of events Y were covered, 15 were not". An 'event' is construed in this context to be one or more variables in a high-level language circuit description taking on one or more values, or sets of values, during one or more simulations, and/or the execution of certain portions of the code of the high-level language circuit description during one or more simulations. An 'event of interest', then, is simply an event in which one or more people are interested in or is an event which a human tester wants present at some point during the testing of the circuit. An event being 'covered' or not, in this context, refers to whether or not the simulation test cases that were applied caused the event to occur. If they did cause the event to occur, the event is covered. If they did not, the event is not covered. In some cases, an event may not occur for any single simulation test case out of a set of simulation test cases, but might be construed as occurring for the cumulative effect of the simulation test cases. For example, if the event in question is the setting of a variable to a logic 'low' state AND a logic 'high' state, one simulation test case may set it 'low' and another 'high', in which case the event could be construed as occurring for the two test cases being run separately.

The use of the word 'estimation' should not be construed as implying an inexact counting of simulation events. The 'flt' program discussed herein does an exact counting of the events being tracked during simulation runs. Rather, the word estimation is meant to indicate that the events kept track of may not completely reveal the extent to which the test cases simulated actually exercise, in a given fashion, the circuit model being simulated. For example, the methods described herein count events related to the single stuck-at fault coverage a set of test cases provides for a circuit model. However, there are many factors that prevent this from being a completely accurate measurement of total fault coverage. First, the circuit description being simulated is a high-level description. In general, the actual implementation of a high-level description of a circuit can be accomplished in a variety of ways, and the number and location of possible single stuck-at faults will vary from one implementation to another. In addition, as is explained in the text, the methods of this invention are designed to give information about single stuck-at fault controllability only. But controllability is only one aspect of total fault coverage: a fault must be made observable at the pins or output terminals of a circuit to have complete fault coverage, in the standard industry definition of single stuck-at fault coverage. The methods of the present invention do not give information on observability, so in this respect also the test coverage numbers must be viewed as an estimation of single stuck-at fault coverage, since some test cases may make certain single stuck-at faults controllable, but does not always guarantee observability.

A gate will refer herein to an electrical circuit which implements a logic function. A gate input will refer to circuit nodes where signals subject to the logic operation are connected. A gate output will refer to a circuit node where the value of the logic function which the gate implements can be observed.

In this text, 'output data' will refer to values which are produced by some data processing system when executing a given set of commands. The output data can be stored in some kind of memory unit, or it can just be utilized temporarily, and then discarded (e.g., viewed on a computer monitor, and then discarded). For the applications discussed in this text, we will most often be discussing output data which is stored in a memory unit. Such storage is generally termed storage in a 'file'. The word 'file', in this context, is meant to denote some predetermined grouping of memory locations within a computing system such that the data stored there can be retrieved, viewed, output to devices such as computer screens, printers, etc., or just manipulated in general, as a whole unit.

Herein, the phrase 'data vectors' shall be used to mean data output by simulation of a model of a circuit, the data either being in the form of ASCII character strings, for example "E 101011", where the symbols '1' and '0' are meant to denote ASCII representations of those integers, and not the actual integers themselves, or the phrase 'data vectors' can mean data output in the form of binary bit patterns.

Herein, the phrase 'clock cycles', when used in reference to simulation, will be synonymous with the term 'simulation cycles'. A digital simulator evaluates all nodes of a circuit during one simulation cycle. Quite often, users of simulators like to designate a given number of simulation cycles as being equal to one clock cycle of their real circuit, i.e., their hardware implementation of the circuit. But, for the purposes of the discussion herein, we can consider simulation and clock cycle to be synonymous. The phrase 'total test clock cycles' then is taken to mean the total number of simulation cycles needed to apply a given set of input patterns to a circuit model during simulation.

Herein, a 'finite state machine', or just 'state machine', shall refer to an electrical circuit, or a model of an electrical circuit, which has certain memory elements which are considered to hold the 'state' of the circuit, a 'state' being a predetermined set of true/false, or high/low values on the outputs of those memory elements. The 'finite state machine', or 'state machine' also has the property that there is a predetermined behavior for changing from one set of patterns on the outputs of those memory elements to another. These are called 'state transitions'. The predetermined behavior is that certain values, when applied to the inputs of the circuit when the circuit is in a given state will cause the state-holding memory elements to either take on a particular new set of values at their outputs, or, possibly, retain their old values.

Herein, a 'memory unit' will refer to any type of electrical device, or set of devices, capable of retaining information for some predetermined period of time. A 'bus' will be any connection between electrical devices such that information can pass between those elements. A 'central processing unit', or CPU, will refer to any one of a number of electrical devices capable of computation.

The concepts of a 'fault', 'fault test', 'fault coverage' and 'single stuck-at fault' will now be defined. Fault tests are input patterns, i.e., a designation of logic values to be applied to the inputs of a real piece of electrical circuitry, or a model of that circuitry, such that the tests will, in some manner, reveal the existence of a 'fault', which is an error, or defect, and, in the context of this text will refer to a manufacturing defect, as opposed to a design defect. Fault tests for manufacturing defects must assume what is called a 'fault model'. The most common fault model is the single stuck-at fault, in which the inputs or outputs of a given logic gate are individually modeled as being stuck at the logic high or logic low levels. This means that they are unable to transition to other logic levels. The case where two or more inputs/outputs may be stuck at given logic levels is ignored in this model. In standard industry usage, to say that a test case 'covers' a given single stuck-at fault, it is necessary to show that the test both controls the fault, and makes the fault observable at the pins of the chip, where observability means that a given output pin would have a different value on it, at a given moment in the test, if the manufactured circuit were faulty than it would if the manufactured circuit were not faulty. In this document, we will focus on fault tests of gate inputs. However, the general methods of 'flt' allow for test coverage estimation of faulty gate outputs as well.

Fault controllability is the ability of a sequence of values applied to the input pins of a circuit to put a logic gate into a state in which a faulty condition at one of the gate's inputs will be apparent at the gate's outputs. Fault observability refers to the ability of that sequence of inputs, or, as is usually the case, a further sequence of inputs, to propagate a faulty gate output to the chip's output pins. Not all single stuck-at circuit faults are testable in this manner, i.e., not all such faults are either controllable and/or observable.

Fault coverage is the ability of a set of test patterns, which once again are a designation of logic values to be applied to the input either of a real, hardware implementation of an electrical circuit, or a software model of that circuit and a designation of the timing of their application, to control and/or make observable each of a set of faults that are deemed to potentially be able to occur in the electrical circuit. It is possible to restrict the use of the term 'fault coverage' to an estimate of the extent to which a set of test patterns controls single stuck-at fault, as opposed to making such faults observable at the pins of the chip. We will often discuss such a type of fault coverage in this document, because the means of this invention give us an estimate of such single, stuck-at fault controllability.

In general, it is standard industry practice to obtain input/output sequences from simulation of certain test cases, cases which have been determined to be effective at detecting a given class of manufacturing defects, such as single stuck-at faults, and then use these sequences as a standard against which to compare manufactured parts. If a manufactured part fails to produce the same output sequence as the simulator when a given input sequence is applied, then the part is deemed 'faulty'.

It is necessary to define some terms used in reference to the present invention, namely 'flt', 'table files' and 'trak_files'. 'flt', herein, is a term used to described the present invention as a whole. A 'table file', herein, will refer to a file generated by the methods of this invention which contains information useful for relating simulation output data produced as a by-product of this invention, to various lines of code in an original, high level language description of a circuit. Examples of 'table files', and a fuller explanation of their purpose vis-a-vis the present invention, will be given in this text. 'trak_files' are specialized simulation output data files, produced by the methods of this invention.

With regards to notation, the following symbols will be used to begin an end comments in code examples:'/*', '*/'. This is standard usage for the C programming language, and we will adopt that usage in this document. Comments are non-executable lines of code in a high-level language program. The following, then, would be an example of a comment in our notation:

/* this is a comment */

We will use comments to give labels for code examples.

The following is a detailed description of the invention. The present invention, 'flt', overcomes many of the disadvantages stated above with respect to present day usage of simulators, and it can be more fully understood with reference to FIGS. 1–8 herein.

FIG. 1 generally illustrates an electrical circuit or integrated circuit 10 having an AND gate 14, in between portions of circuitry 12 and 16. Circuitry 12 and circuitry 16 may be any portion of a general electrical circuit, which circuit 10 incorporates. Any circuit such as circuit 10 will have input pins and output pins (input and output terminals), as shown in FIG. 1. Input pins are where input stimuli are applied to the circuit 10. In an actual circuit these are applied in terms of voltage and/or current levels. In a simulation of a model of the circuit, they are applied in the form of a test case input to the simulator, which consists of commands to the simulation program to apply certain logic values to various of the modeled input pins at various cycles of the simulation. The output pins in circuit 10 can be monitored to see what logic values circuit 10 produces, once stimuli are applied to the input pins of FIG. 1. If circuit 10 were implemented in hardware as, for example, a packaged integrated circuit, the output pins would be the only points in the circuit 10 where logic values would be externally accessible/visible (since the package would inhibit probing of internal circuit nodes). In a simulation, all internal circuit nodes, in addition to the output pins, can be monitored, since all values of any variables in an executing software program are potentially available.

The following is a code example of how 'flt' will work in conjunction with the circuit of FIG. 1. AND gate 14 in FIG. 1 has two inputs, labeled 'a' and 'b'. In addition, the AND gate 14 has one output, labeled 'c'. The AND gate 14 may be modeled in an HDL, or a regular high level programming language, by a particular type of assignment statement. Assignment statement A, below, is an example of such an assignment statement, and it models AND gate 14 from FIG. 1:

c=a&b; /* assignment statement A */

In assignment statement A, the symbol '&' stands for the logical AND operation. The expression 'a&b' is the right hand side of assignment statement A, and is the expression to be evaluated. The symbol '=' is used to indicate that whatever value results from evaluation of the right-hand side should be assigned to the left-hand side, or lvalue, 'c'.

The present implementation of 'flt' would instrument the file containing assignment statement A in such a way that assignment statement A was surrounded by monitor code that effected three types of checks during a simulation:

Execution checks: code to determine if a given assignment statement was ever executed.

Dead-logic checks: If the right hand side of an assignment statement is an expression with two or more variables and at least one binary logic operator, and if the lvalue is a Boolean data type, a dead-logic check determines if the lvalue was set into both the high and low logic states during the course of a simulation.

Behavioral-controllability checks: If the right hand side of an assignment statement is an expression with one or more binary logic operators, a behavioral-controllability check determines if all the entries in the truth tables of those operators were simulated which are pertinent to single stuck-at fault controllability.

After processing by 'flt', the assignment statement A would be placed between segments of monitor code effecting the above three checks, in the following manner (the following code example will be termed code example B):

```
/* code example B */
if (E_chk[12] == '0')
    E_chk[12] = '1';
c = a & b;
switch (T_chk[tbyte_6335]) {
    case 'x':
        if (c)
            T_chk[tbyte_6335] = '1';
        else if (~c)
            T_chk[tbyte_6335] = '0';
        break;
    case '0':
        if (c)
            T_chk[tbyte_6335] = '2';
        break;
    case '1':
        if (~c)
            T_chk[tbyte_6335] = '2';
        break;
    default:
        break;
}
if (F_chk[fbyte_6335] != '1') {
    if (a & b)
        F_chk[fbyte_6335] = '1';
    else if (F_chk[fbyte_6335] == 'x')
        F_chk[fbyte_6335] = '0';
}
fbyte_6335++;
if (F_chk[fbyte_6335] != '1') {
```

```
        if (~a & b)
            F_chk[fbyte_6335] = '1';
        else if (F_chk[fbyte_6335] == 'x')
            F_chk[fbyte_6335] = '0';
    }
    fbyte_6335++;
    if (F_chk[fbyte_6335] != '1') {
        if (a & ~b)
            F_chk[fbyte_6335] = '1';
        else if (F_chk[fbyte_6335] == 'x')
            F_chk[fbyte_6335] = '0';
    }
```

In the above code example B, the symbol '~' stands for negation. Code example B is all legal code in the 'C' programming language. The 'C' programming language is a subset of legal code for the 'M' hardware description language of Mentor Graphics Corp., so the above example of code would be executable in any simulator that simulated valid M language code.

The E_chk, T_chk and F_chk variables in code example B are symbols for character arrays, where the purpose of each array member is to keep track of a specific simulation event occurring, which may be a given variable being updated with a given logic value, or a given set of variables being updated with a given set of values, or even a particular assignment statement, such as assignment statement A just having been executed. The E_chk, T_chk and F_chk character arrays keep track of execution checks, dead-logic checks and behavioral-controllability checks, respectively. The index of an array element correlates it with a particular simulation event (the correlation is made by executing a separate program, called in this document a 'table file', which will be discussed later). The tbyte_6335 and fbyte_6335 variables are integers, inserted into the file to keep track of placement in the T_chk and F_chk arrays. Their numerical suffixes (e.g., '6335') are chosen at random by code in the executable 'flt' program, for the purpose of avoiding possible name clashes with variables declared in the original file. In this example, it is assumed that both tbyte_6335 and fbyte_6335 have been set to appropriate values elsewhere in the file, before the above code sample would be reached during execution, thus enabling the proper elements of the T_chk and F_chk character arrays to get updated.

All the elements of the T_chk and F_chk character arrays in the code example B are initialized to 'x'. All the E_chk character array elements are initialized to '0'. 'Initialization' refers to the practice of assigning an initial value to a variable inside a simulation program before actual simulation of the circuit begins. It is common for all simulators to have a facility that enables initialization of variables. If an E_chk character array element is still '0' at the end of the simulation, it means that a particular assignment statement was never executed. In the present implementation of 'flt', T_chk character array elements can have the values 'x', '0', '1' or '2'. If a T_chk character array element is still 'x' at the end of a simulation, it means that a particular dead-logic check was never simulated. A '0' means the variable subject to assignment, which in this example would be the lvalue, 'c', of assignment statement A, was only low, never high, a '1' means just the opposite, and a '2' means that the lvalue was in both the high and low states (and the check was successful). F_chk character array elements can have the values 'x', '0' or '1'. A value of 'x' in a particular F_chk character array element at the end of a simulation means that the section of code containing assignments to that character was never reached during the simulation, a '0' means the behavioral-controllability check monitored by that element of the F_chk character array was simulated, but never satisfied, and a '1' means that it was simulated and satisfied. As can be understood from the above coding example, satisfying a behavioral-controllability check means satisfying a particular logic expression, i.e., some time during the simulation activity a certain set of logic values was assigned to a certain set of Boolean variables.

The methods of 'flt' aid in determining the fault coverage of a particular logic gate in the following manner:

If an execution check fails, it is certain that the test case applied is inadequate for fault-testing any and all logic gates modeled in the particular assignment statement being monitored by the execution check. This is because the model of the gate is encased in the assignment statement, and if the assignment statement is not reached and executed, the test code, when applied to the inputs of the real circuit, would not exercise the real logic gate in the circuit.

If a dead-logic check fails, it means that one or more circuit nodes may not have toggled between the high and low, or true and false logic states. This may, or may not, indicate problems in testing single stuck-at faults in the real circuit, as is elaborated on below.

If a behavioral-controllability check fails, it is certain that the test code applied would not be able to control a single-stuck at fault for the circuitry being modeled in the assignment statement. This will also be explained more fully below.

Dead-logic checks are a means of determining if a particular lvalue of a particular assignment statement has been set to both the high and low logic states during a simulation. However, the check being made is a check on a single assignment statement, such as assignment statement A, above. A particular variable in a file might be subject to assignment in multiple assignment statements. Take, for example, the following conditional expression C, in which two assignment statements, D and E, can be found:

```
    if (d)                  /* conditional expression C */
        a = b & c;          /* assignment D */
    else
        a = e & f;          /* assignment E */
```

If 'd' is false throughout an entire simulation, only assignment E would ever be executed, never assignment D. So, the dead-logic check for assignment D, if the above code segment were processed by 'flt', would fail. However, assignment E may be executed multiple times, and the results of evaluating the right-hand side of assignment E may be such that the lvalue of assignment E, 'a', is set both high and low. In this case, the variable representing a specific circuit node, 'a', would have been set both high and low, but the dead-logic checks for a particular assignment to 'a', namely assignment D, would fail. However, if the only assignment to the variable 'a' were through a single, non-conditional assignment, such as, for example, assignment statement F:

```
    a=u&v; /* assignment F */
``` and if the dead-logic checks for assignment statement F failed, then it would mean that in the real circuit that bit of test code would be inadequate for setting the real circuit node associated with the variable 'a' to both the high and low logic states. And, this would result in an inability to fault test any logic gates for which that node served as an input.

Behavioral-controllability checks are the most direct measurement of fault test coverage. Each behavioral-controllability check is designed to monitor whether a certain set of variables was assigned a certain set of logic values. The rationale is as follows: each type of logic gate in a circuit, whether AND, OR, XOR, etc., has a truth table associated with it, i.e., for every possible input combination to that logic gate there is a predetermined value that will result on the gates outputs. For single stuck-at fault testing of gate inputs, we are only interested in simulating those gate input combinations, i.e., those elements of the gate's truth table, that will result in an incorrect gate output if one of the inputs is stuck at a certain value. For example, the truth table G of the 2-input, 1-output AND gate 14 in FIG. 1 is as follows:

| /* truth table G */ | | |
|---|---|---|
| a | b | c |
| 0 | 0 | 0 |
| 0 | 1 | 0 |
| 1 | 0 | 0 |
| 1 | 1 | 1 |

Let us assume input 'a' is stuck at logic value '1'. If we apply stimuli to a real, hardware implementation of circuit 10 of FIG. 1 such that the internal circuit nodes 'a' and 'b' would normally both be driven to '0' values, the stuck-at-1 condition of input node 'a' would not result in a noticeable difference at the output, 'c', of AND gate 14. This is because a good, non-faulty version of circuit 10 would have a '0' at the output of AND gate 14, since it would have a {0,0}combination at the gate's inputs, but a faulty version of circuit 10, in which the input 'a' were stuck at '1', would also have a '0' at the output of AND gate 14, since that faulty version would have a {1,0} combination applied to the inputs of AND gate 14. Further investigation would show that a test code sequence that would drive the internal circuit nodes of circuit 10 to a {0,0} combination would not be able to detect ANY single stuck-at condition on either input 'a' or 'b', since even if one input is faulty, if the other is not and is driven to '0', the output of AND gate 14 will always be the same: '0'.

Thus, only certain elements, or rows, of a logic gate's truth table can control single stuck-at faults in a circuit. 'flt' processes an input file containing a circuit description in such a manner that each single stuck-at fault on a single input of a gate is the subject of a behavioral-controllability check, i.e., each input combination of a truth table, such as truth table G, which is needed for controlling a single stuck-at fault on a gate input, is simulated. For the AND gate 14 of circuit 10, FIG. 1, this would mean that behavioral-controllability checks would be inserted to ascertain whether the inputs to AND gate 14, {a,b}, were set equal to {1,1}, {0,1} and {1,0}, respectively. A glance at code example B will show that the three behavioral-controllability checks there will be satisfied if and only if {a,b} are set to these values some time during the simulation.

Code example B, above, illustrated how an HDL model of AND gate 14, of circuit 10, FIG. 1, might have its test coverage estimated by the methods of 'flt'. If an OR gate would have been in the same position in circuit 10 as AND gate 14, and if such an OR gate would have had two inputs labeled 'a' and 'b', and a single output labeled 'c', then code example B would have differed only in one of the behavioral-controllability checks, the check for whether inputs, {a,b}, were ever in the {1,1} configuration, namely the lines of code:

```
if (F_chk[fbyte_6335] != '1') {
    if (a & b)
        F_chk[fbyte_6335] = '1';
    else if (F_chk[fbyte_6335] == 'x')
        F_chk[fbyte_6335] = '0';
}
``` would be changed to the following:

```
if (F_chk[fbyte_6335] != '1') {
    if (~a & ~b)
        F_chk[fbyte_6335] = '1';
    else if (F_chk[fbyte_6335] == 'x')
        F_chk[fbyte_6335] = '0';
}
``` which is a behavioral-controllability check to monitor whether {a,b} were ever in the {0,0} configuration. This is because the {1,1} combination on the inputs of a 2-input OR gate cannot control a single stuck-at fault on either input, while the {0,0} combination can. The {0,0} combination controls the stuck-at high fault on either OR gate input.

A special case of code generation for behavioral-controllability checks takes place for multiple operand (operands greater than 3) XOR and XNOR operations. (2-input XOR/XNOR operations can be fault tested like an OR gate). XOR and XNOR operations are, essentially, parity checkers, and fault testing consists of checking for a particular input being in a particular logic state while either an even or an odd number of other inputs are in certain logic states. Take, for example, the assignment H:

$$e = a\char`\^b\char`\^c\char`\^d; \text{ /* assignment H */}$$

where '^' is used as a symbol for an XOR operation. The behavioral-controllability check for the 'a' operand of assignment statement H is to check if it was low when an even number of other operands were high, and if it was high when an even number of operands were low. For the first case, checking for 'a' low and an even number of other operands high, 'flt' would generate the following code (code example I):

```
/* code example I */
if (F_chk[fbyte_6553] != '1') {
    if (~a) {
        high_cnt_6553 = 0;
        if (b)
            high_cnt_6553++;
        if (c)
            high_cnt_6553++;
        if (d)
            high_cnt_6553++;
        if ( high_cnt_6553 % 2 == 0 )
            F_chk[fbyte_6553] = '1';
        else if ( F_chk[fbyte_6553] == 'x' )
            F_chk[fbyte_6553] = '0';
    }
}
```

If this check fails, it means that 'a' never was low while either zero other inputs were high, or any combination of 2 of the 3 other inputs was high. This is a total of four different logic expressions that all failed to materialize during the course of a simulation. Had any one of the four been simulated, the behavioral-controllability check would have been satisfied.

The 'flt' program discussed herein uses several memory files during the course of it's operation.

Figure 2:
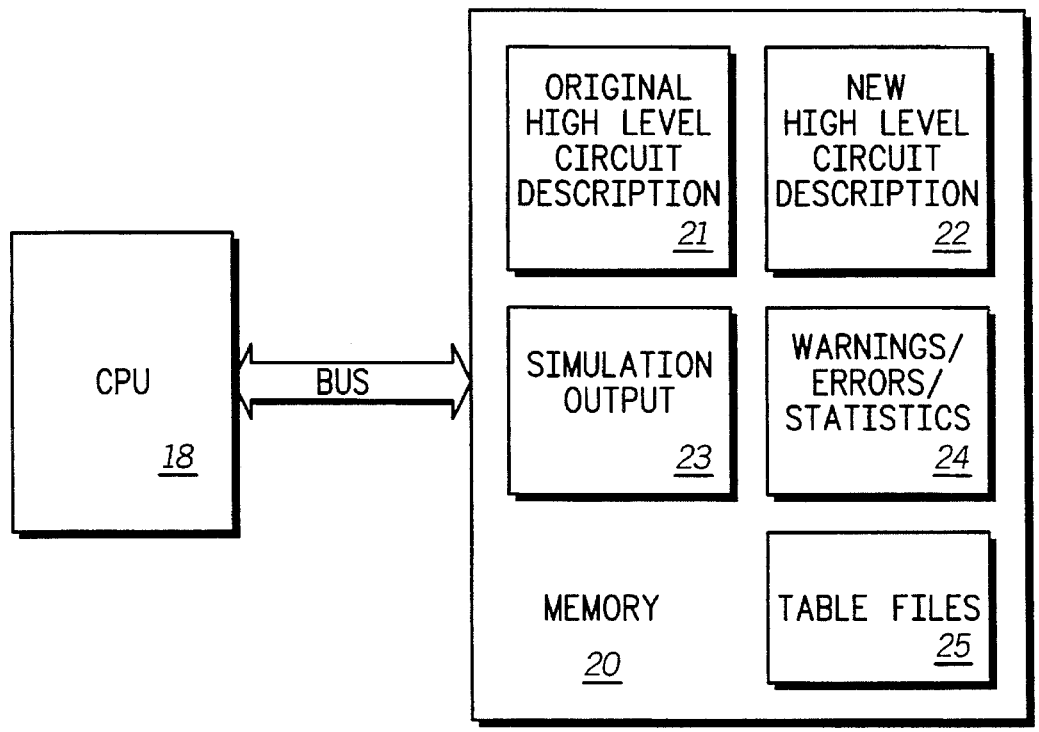
FIG. 2 illustrates, in a block diagram, a test coverage estimation system in accordance with the present invention.

FIG. 2 illustrates a data processing system which may be used to perform test coverage estimation in accordance with the present invention. FIG. 2 illustrates a central processing unit (CPU) 18 coupled to a memory unit 20 via a bus. Inside the memory unit 20 there is an original high level circuit description 21, which is a file, or set of files, containing a high level language, possibly HDL, description of an electrical circuit and there is a new high level language, possibly HDL, circuit description 22, which is a file, or set of files, containing a description of the same circuit as is modeled in the original high level language description 21 but with monitor code added to estimate test coverage. There is a file, or set of files, of simulation output 23, there is a file, or set of files, 24, of warning and error messages and statistics, and there is a file, or set of files 25 called 'table files', which are used for post-processing the simulation output 23 and obtaining the files, or set of files labeled 24 containing warning and error messages and statistics on test coverage.

The above five elements found in memory, labeled 21, 22, 23, 24 and 25 will now be explained in more detail, and their relationship to the invention, 'flt', more fully explained.

The original high level circuit description 21 is a file, or files, written in a high level programming language, which, as explained previously, could be a specific type of HDL, such a Verilog, VHDL, M, etc., or a regular high level programming language, such as C, Pascal, etc. This file, or set of files, contains, among other types of expressions, assignment statements that conform to the manner of assignment statements described above (having a left-hand side, right-hand side, assignment operator, etc.). These assignment statements will vary in their syntax, in accordance to the rules of the particular language they are written in, but they will conform in a general way to the broad definition of assignment statements given previously. Information on electrical circuit functionality, on the interconnectivity of electrical circuit elements, etc., will be contained in these assignment statements.

The new high level circuit description 22 is a file, or set of files, created by the processing of the original high level language description 21 by an implementation of the invention, 'flt'. This file, or set of files, will usually be written in the same language as the original high level language description 21. As was true of the original high level circuit description 21, the new high level circuit description 22, contains, among other types of expressions, assignment statements, which conform, to the general definition of assignment statements given earlier in this text. The new high level language description 22 preserves all the semantics of the original high level language description 21. Therefore, it models the same electrical circuitry. In addition, it has entirely new expressions that the methods of this invention injected/added into the file, or set of files, comprising the high level language description 22. The purpose of this new code is to effect test coverage estimation as discussed above.

The simulation output 23 is specific simulation output data produced by commands executed in the file, or set of files, of the high level circuit description 22, when that file, or file set, 22 is executed in a simulation environment. The simulation program itself must be executed by a CPU such as CPU 18. The CPU 18 directs the outputting of the files to a memory unit, such as memory unit 20 (or, the output could go to a memory unit on a computer network, magnetic media, or some arbitrary location—it would not change the essence of this invention). This simulation output 23 will consists of specially formatted ASCII and/or binary files, and it can be postprocessed, in a manner to be described later on in this text, so as to yield warning messages, error messages and statistics pertaining to simulation test coverage. In general simulation output contains information from simulating the description 22 with a given set of input test vectors. These messages and statistics comprise the file, or set of files labeled "warning/errors statistics" 24 in FIG. 2.

The 'table files' 25 in FIG. 2 are files created at the same time the new high level language description file, or set of files, 22 is created. The 'table files' are used by the 'flt' invention as a means of relating the information found in the simulation output 23 back to particular assignment statements in the original high level circuit description 21.

The files, or sets of files 21, 22, 23, 24 and 25 can be described as having the following relationship to each other: if a circuit designer, or any other person, or even some automatic program, creates a file or set of files such as original high level circuit description 21, which describe the functionality and interconnections of an electrical circuit, then the methods of the invention described herein, which consists partly of the parsing of the original high level circuit description 21 and the outputting of new code based on the information obtained during the parse, can be used to produce and store in some memory unit (such as memory unit 20) a new file or set of files comprising a new high level circuit description 22. The new file or set of files 22 having all the code necessary to preserve the original high level circuit description 21 plus having monitor code inserted in such a way as to effect test coverage estimation (in the manner described elsewhere in this text) and in addition to this new high level circuit language description 21 there would be created a file, or set of files, called 'table files', 25, which would aid in the correlation of simulation output data 23 back to the original high level circuit description 21. This new high level circuit description 22 can then be input to a digital simulation program, which would then cause a simulation output file, or set of files 23 to be created. Post-processing of this simulation output 23 by the methods of this invention, which would involve referencing the table files 25, would then cause the file, or set of files 24, containing warning and error messages and statistics to be produced.

In the above description, the execution of the parsing of the files, the outputting of new code, the act of storing a file or set of files in memory unit 20, the execution of a simulation program and the outputting of the file or set of files 24 by post-processing of simulation output data and by referencing the table files 25, this and other similar operations would all be accomplished by the CPU 18 or a like execution device.

Figure 3:
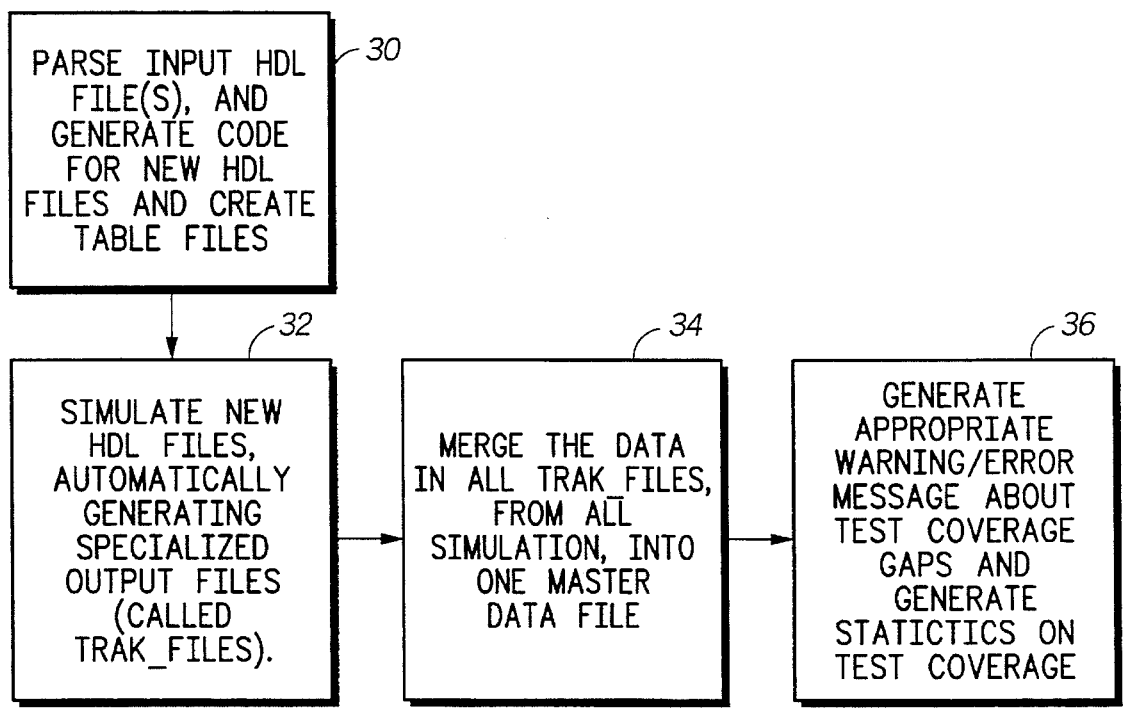
FIG. 3 illustrates, in a flowchart, a method for determining test coverage estimation in accordance with the present invention.

FIG. 3 illustrates a flowchart showing how the data processing system of FIG. 2 proceeds when manipulating and/or creating the files or sets of files which are illustrated in FIG. 2.

Step 30 of FIG. 3 is accomplished as follows: given an original high level description file, or set of files, describing an electrical circuit, such as the original high level description 21 of FIG. 2, an implementation of the 'flt' invention would parse that file or set of files. For the purposes of the discussion in this section, we will term this file or set of files, the one designated as original high level language description 21, as the 'input HDL file(s)', making the assumption that the circuit description was given in a high-level language that conforms to the type usually referred to as an 'HDL'. Parsing is the process of reading in the expressions in the original HDL file, or set of files, and categorizing these expressions according to the rules of the grammar of the particular language they are written in (such as Verilog, M, etc.).

Information is obtained in this manner as to the types of variables declared in the original high level description, the names used for these variables, in the case of arrays of variables the sizes of those arrays, information is obtained as to the location in the HDL file or files of assignment statements, the context these assignment statements are found in (for example, inside of conditional expressions, inside of loop constructs which will be iteratively executed, etc.), and other such pertinent bits of information. On the basis of this information obtained during the parse, a new HDL file, or set of files, can be created, this new file or set of files containing a description of the same circuit as that of the input HDL file(s). This new file, or set of files would preserve all the semantics of the original description, so that the description of the functionality and interconnections of the circuit was unchanged, but the new description would have some specially created variables for the purpose of monitoring simulation events, and specially created 'monitor code', consisting of conditional assignments to those variables, which would allow the tabulation of simulation test coverage as the new HDL files were executed inside of a simulation environment. In addition, the parsing and code generation operations of step 30 would result in the creation of one or more table files. Each table file will relate to a single input HDL file, and its purpose is to relate simulation output data back to the original input HDL file. This relationship will be made more clear in the discussion of step 34.

Step 32 of FIG. 3 describes the simulation of the new HDL files. As mentioned previously in this text, a simulator needs commands to be given to it which specify what the logic values should be on the inputs to the circuit model it is simulating, for every simulation cycle that is run. The 'flt' invention has nothing to do with the creation of, or choice of these commands to the simulator. In other words, the choice of simulation 'test case', to use the terminology adhered to earlier in this document, is left entirely up to the user of the invention. Once an input test case, or set of test cases (i.e., test vectors), is chosen and is used during a simulation run in which the new HDL description of a circuit is simulated, then specialized output files will be created, which in this text and in the current implementation of the 'flt' method can be termed 'trak_files'. These trak_files contain information about the coverage obtained by the selected test case or set of test cases, relative to the circuit model being simulated.

The present implementation of 'flt' forms/uses output files (track files) as follows: At the end of a simulation, code in the new HDL file created in step 30 will print out the contents of the E_chk, T_chk and F_chk arrays, which were discussed relative to code example B, to a trak_file output file. In addition, the new HDL files created by 'flt' in step 30 will perform some simple arithmetic operations that will allow it to output some simple test coverage statistics to the trak_file. These statistics would indicate things such as, for example, the percentage of execution checks which succeeded, based on the number of elements in the E_chk character array that had a value of '1' as opposed to a value of '0'. Or, it would output the percentage of behavioral-controllability checks which succeeded, based on the number of elements of the F_chk array that were '1', relative to elements that were '0', or 'x', etc..

Step 34 of FIG. 3 comprises the post-processing of these trak_files. It is common practice when trying to verify a circuit design to run more than a single test case, i.e., to invoke the simulation program multiple times, each time with a different test case, but each time simulating the same circuit model, which in this case we will assume to be the new HDL version of a circuit obtained by the method of Step 30, FIG. 3. The present implementation of this invention uses a program called 'merge_output' to perform this task of merging the simulation output from each test case, the special simulation output discussed in step 32. The merge_output program will merge the character strings found in any particular trak_files, which were the output of the E_chk, T_chk and F_chk arrays generated in step 32, with other string output found in other trak_files created during other simulations. The merged strings will then be sent as command line arguments to executable versions of the table files, whose creation was discussed in step 30.

Step 36 consists of the creation of a file, or set of files, of warning and error messages about test coverage gaps. The creation of a file, or set of files, containing statistics on the total test coverage (for all the test cases whose results were merged in step 34). The warning and error message files, or sets of files, are created by successive calls to executable versions of the table files mentioned in steps 30 and 34. The calls occur during the merging process of step 34, discussed above. The table files will print out appropriate messages for each event not simulated, based on a correlation between the position of a character in a string and the event that character was supposed to monitor.

The code examples printed previously are used to illustrate the new HDL files created as per step 30 of FIG. 3. Below, code example J illustrates some typical code for a table file, a type of file whose creation by this invention was discussed relative to step +of FIG. 3,:

```
/* code example J */
if (E_chk[6] == '0')
    fprintf("sim_error",
        "hdl_1:cin_b not assigned on line 37 \n");
if (E_chk[7] == '0')
    fprintf("sim_error",
        "hdl_1: stcky not assigned on line 41 \n");
```

This is just a general example, given in the C programming language. The meaning is as follows: if the 7th element in the E_chk array (starting counting from 0) is a '0', then the message "hdl_1: cin_b not assigned on line 37" will be printed to an output file "sim_error" (for "simulation error") file. 'hdl_1" would be the name of the original HDL file, used as input in step 30 of FIG. 3. "cin_b" would be the lvalue subject to assignment if one looked in that input file of step 30 on program line 37. In this manner, the table file, when executed, would correlate a value of an element in a character array with a warning or error message about a simulation event that did, or did not occur.

Figure 4:
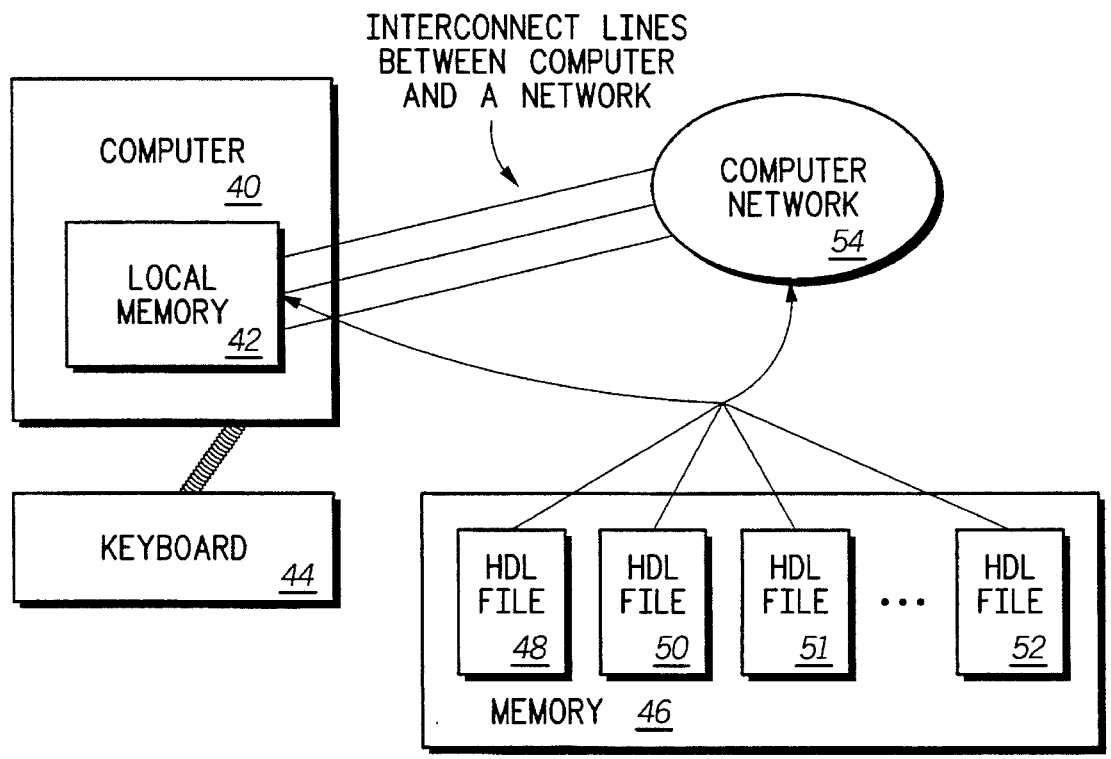
FIG. 4 illustrates, in a block diagram, a test coverage system in accordance with the present invention.

FIG. 4 is a further illustration of the environment in which the data processing system of FIG. 2 operates. FIG. 4 illustrates the environment for the model parsing and code generation of Step 30 of FIG. 3.

A Computer 40, which has an internal local memory 42 and a keyboard 44 is illustrated in FIG. 4. The keyboard 44 is the location at which a human user of the data processing system types in various commands. The computer 40 can be connected to a computer network 54, although this is not strictly necessary for the data processing system to function as intended. HDL files 48, 50, 51 and 52 are shown residing in memory 46. The 'flt' invention described in this text will read input HDL files from the memory or the HDL files can exist distributed in various memories along a computer network, such as computer network 54. The 'flt' invention described in this text will then perform the parsing and code generation steps described in the text above, and illustrated pictorially in FIG. 3, Step 30, on each HDL file. In FIG. 4, Step 30 of FIG. 3 would be performed in turn on each of HDL file 48, HDL file 50, HDL file 51 and HDL file 52, each shown in FIG. 4 as residing in memory 46. It is not shown, but it is understood that the new HDL files produced by this code generation process, and the table files produced by this process, the items corresponding to the "new high level description 22" and "table files 25" of FIG. 2, would end up residing in memory, which may be either memory 46 of FIG. 4, or a set of one or more memory units distributed along computer network 54 of FIG. 4.

Figure 5:
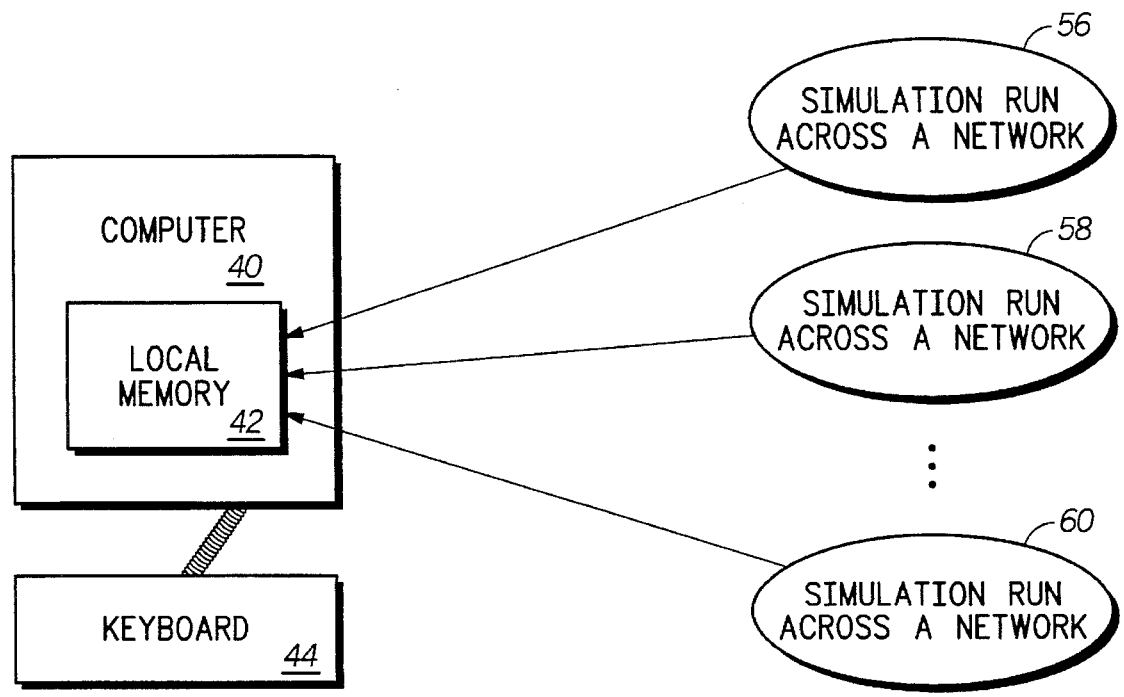
FIG. 5 illustrates, in a block diagram, a test coverage system in accordance with the present invention.

FIG. 5 illustrates the environment in which multiple simulations are run, each simulation being a simulation of HDL files created by the 'flt' parsing and code generation methods illustrated in FIG. 4 and in Step 30 of FIG. 3.

FIG. 5 illustrates the same computer 40, with local memory 42 and keyboard 44 as was illustrated in FIG. 4. In FIG. 5, three simulations are explicitly shown as being in progress, simulations 56, 58 and 60. In FIG. 5, simulations 56, 58 and 60 are intended to represent three out of some arbitrary number of simulations that are being run on computers distributed across a computer network, with the results of the simulations being written back into the local memory 42 of computer 40. This arrangement is perhaps the most efficient way to run multiple simulations of 'flt'-generated HDL models. However, it is not the only way. For example, each of simulations 56, 58 and 60 could be run, either serially or concurrently, in local memory 42 of computer 40. Or, there could exist some combination of simulations being executed across a network and in local memory 42. Also, the simulation results do not necessarily need to be written back to a single memory unit such as local memory 42 of computer 40. Some number of these simulations could be written to memory units that are distributed along a computer network.

Figure 6:
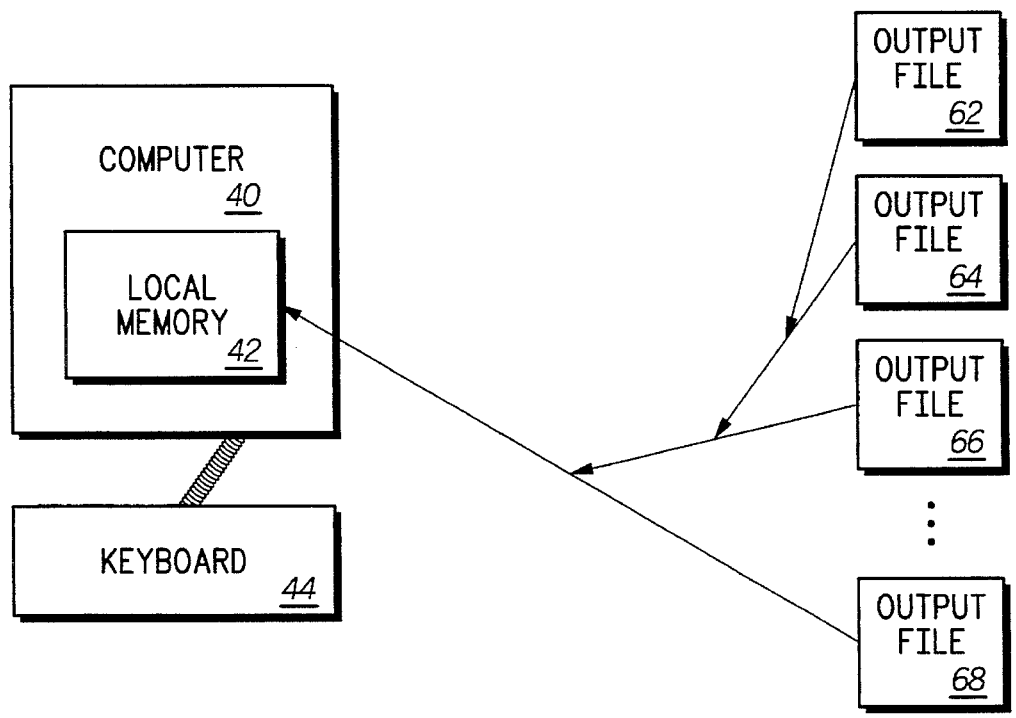
FIG. 6 illustrates, in a block diagram, a test coverage system in accordance with the present invention.

FIG. 6 illustrates the environment in which the data processing invention, 'flt', would merge the results of simulations such as simulations 56, 58 and 60, which were illustrated as executing in FIG. 5.

FIG. 6 also depicts the computer 40, with local memory 42 and keyboard 44, as did FIG. 5 and FIG. 4. Output files 62, 64, 66 and 68 are illustrated. The output files 62, 64, 66, and 68 are able to reside either in local memory, such as memory unit 42, or in other memory units distributed along a computer network.

The merging of output from files such as the files 62, 64, 66 and 68 is done by a 'merge_output' part of the 'flt' invention, and is illustrated in Step 34 of FIG. 3. It has also been discussed in the text above. The merging process begins by arbitrarily choosing a single file to be the beginning file, say output file 62. Then a second file is chosen to be merged with it, say output file 64. The output that is merged is some data which was output by the new HDL files created by the 'flt' parsing and code generation processes, as per Step 30 of FIG. 3, and any character strings being output once these HDL files were simulated, as per Step 32 of FIG. 3.

The merging process is roughly equivalent to a logical OR'ing of the data. It will be discussed in more detail later on. It should be stressed here, however, that character strings are only one kind of output that could possibly be generated when the new HDL circuit descriptions created by this invention, such as the new high level description 22 of FIG. 2, are simulated. For example, outputting of binary data is possible, and may in many cases be more efficient. The techniques of the merging process may be slightly different, but the concept remains the same: determine whether ANY of the simulations that were run covered a given event, and if even just one of them did, mark that event as 'covered', if not, mark that event as 'not covered' in some fashion.

In this context 'covering' an event signifies simulating that event. An 'event' may be the execution of an assignment statement (monitored by conditional assignments to E_chk array elements in code example B), or it may be the setting of an lvalue to both true and false logic values during a simulation (monitored by conditional assignments to T_chk array elements in code example B). In addition, an 'event' may be the setting of a predetermined set of variables to a predetermined set of logic values during a simulation (an example of which is the behavioral-controllability checking monitored by conditional assignments to F_Chk array elements in code example B), or it may be satisfying some other type of check on the simulation results.

As is clear from studying the example of the assignments to the T_chk array elements in code example B, what is termed an 'event' to be 'covered' during simulation may actually necessitate multiple simulation cycles. In the case of dead-logic checks, to use the terminology previously introduced, dead-logic checks are monitored by conditional assignments to the T_chk character arrays in code example B. Satisfying a dead-logic check means the setting of a particular element of the T_chk array to the value '2'. A glance at code example B will reveal that this is impossible to achieve in a single simulation cycle. It necessitates at least 2 simulation cycles. This is because the setting of a T_chk element to the value '2' is done if and only if the particular lvalue that T_chk element is intended to monitor has been set to both the true and false logic states, which necessitates at least 2 simulation cycles.

Figure 7:
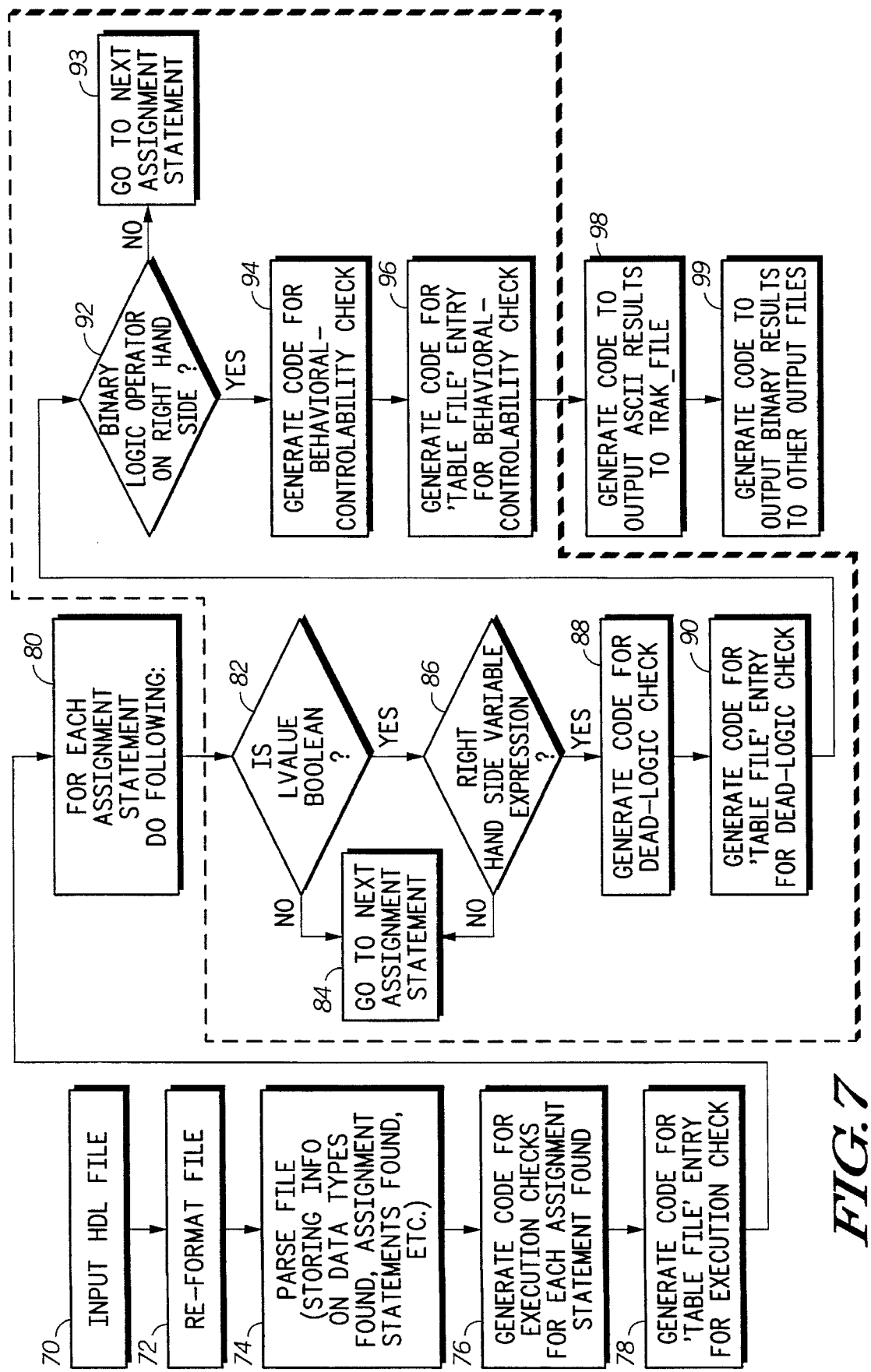
FIG. 7 illustrates, in a flowchart, a control flow for test coverage code generation in accordance with the present invention.

FIG. 7 illustrates the control flow used by the data processing system of FIG. 2 to effect the generation of new code. The new code is termed 'flt HDL model' in FIG. 7. This means that it is the 'flt' invention that is generating a new circuit model, and it is being assumed that the high-level programming language used is one that meets the general description of an HDL.

Step 70 of FIG. 7 is the accessing and reading of a single HDL file. This step has been discussed above with reference to FIG. 4, where it is shown how a computer system can be constructed which would facilitate such file reading and file access.

Step 72 of FIG. 7 is a step wherein the format of the original HDL file is altered, and a new format created. This may include things such as deleting comments, insuring that each assignment statement occupies a line of a file (most languages allow multiple assignment statements on a single line, as long as they are separated by a legal separation symbol, however this may be inconvenient for the file processing 'flt' does). Step 72 is not necessary in any way for the basic methodology of 'flt', but is just a convenience. It exists in the present implementation of the system, but does not need to exist for the invention to function as intended.

Step 74 of FIG. 7 is the step of parsing the input HDL. Parsing has been discussed earlier, and is simply a technique whereby grammar rules of the particular high-level language the input file is written in are used to recognize various types of expressions that are legal in that language. Parsed information is gained regarding declarations of variables, assignment statements, logic operations, etc.. In Step 74, information on the file gained during the parse is stored in data structures in memory. Examples of such stored information are variable names and their associated data type, indications as to whether a variable has been declared as an array or not and if it has the size and number of elements of the array, the location of assignment statements in the file, and information as to the type of assignment, for example, assignment from a constant, assignment from an expression containing one or more variables, etc.

Step 76 of FIG. 7 is the step of generating code for execution checks, which have been defined and explained above. An example of an execution check is the conditional assignment to the element of the E_chk array in code example B, above. Execution checks monitor whether a particular assignment statement is ever reached and executed during the course of a simulation. The generated code may be stored in data structures in memory (where the memory unit may be local to the computer being used, or may be connected to that computer via some kind of computer network), or the generated code may be output to the new HDL file being built. If it is stored in data structures in memory, then it will be output at some future time.

Step 78 of FIG. 7 is the generation of code for the 'table file' that will be created. As discussed above, one table file is created for each new HDL file generated. The table file aids in correlating simulation output data, data output by the newly generated HDL file when executed in a simulation, with a particular line of code in the original HDL file, so that an informative message may be output to the user as to where gaps in test coverage exist. An example of typical table file code was given above in code example J.

Step 80 of FIG. 7 is meant to denote a loop in which steps 82 through 96 are executed for each assignment statement in the input HDL file. Steps 82 through 96 generate two kinds of code: code relating to dead-logic checks and code related to behavioral-controllability checks. The code generated is eventually output to both the new HDL file being created and the related table file for that new HDL.

Step 82 of FIG. 7 denotes a test and a decision. For the particular assignment statement being investigated, its lvalue is examined and compared to a list of lvalues and their declared data types, the latter list being obtained during the parse of the input file in Step 74. If the lvalue is of Boolean data type, the procedure continues. If it is not, no further code is generated for that particular assignment statement, and the next assignment statement in the HDL file is accessed (this is Step 84). If the lvalue examined in Step 82 of FIG. 7 was of Boolean data type, then Step 86 is executed.

Step 86 also denotes a test and a decision. If the right-hand side of the assignment statement is a variable expression, i.e., if it is some legal expression in the high-level language being used that contains at least one variable, in addition to possible constants, then the procedure continues. If it is not, then step 84 is executed, and the next assignment statement in the HDL file is accessed. The rationale for step 86 is that one cannot expect an assignment from a constant expression to ever change value, no matter how many times it is executed during a simulation, so there is no sense performing a dead-logic check in this case, since dead-logic checks monitor just that: changes in an lvalue. In order to effect the test in step 86 the list of variables and their data types gained from the parse of step 74 is once again consulted.

Assuming that step 86 reveals that the right-hand side contains at least one variable, then step 88 is executed. Code to do a dead-logic check is generated. One example of such code has been given in the conditional assignments to all the T_chk character array elements in code example B, above. In general, dead-logic check code does not need to look exactly like this, but it needs to be constructed in such a manner as to detect if a particular variable, in this case the lvalue of a particular assignment statement, has been set to both the high and low logic states. As was the case with execution check code generated during step 76, the generated code may be temporarily stored in data structures and output to the new HDL file later on, or it may be output immediately. This is an implementation decision that does not affect the general nature of the invention.

In step 90, table file code for the dead logic check is generated. An example of table file code has been given in code example J. The code example J was for execution checks, but dead-logic checks would be similar. Once executed, table file code for dead-logic checks would, or would not, generate a warning or error message depending on the value of a particular member of a character array input to the table file.

Step 92 is another test and decision step. Here, the expression on the right hand side of the assignment statement is examined to ascertain if it contains at least one binary logic operator. Actually, the test can, in practice, be slightly broader: if the particular high level language in which the circuit description is written contains unary logic operators whose definition is that they symbolize logic operations among individual members of an array, then the existence of such an operator would allow the test made in step 92 to yield a positive result (i.e., the procedure would be to proceed to step 94). Such unary logic operations can actually be expanded to binary logic expressions.

If the test of Step 92 is negative, then no behavioral-controllability code of any sort is generated, and the next assignment statement in the input HDL file is examined. This is illustrated in a Step 93. If the test of Step 92 is positive, then code for behavioral-controllability checks is generated via a step 94.

Step 94 is the step of generating the actual code for behavioral_controllability checks in FIG. 7. The conditional assignments to F_chk character array elements in code example B are examples of behavioral-controllability code. Also, code example I illustrates behavioral-controllability checks, in this case for an XOR operation. As was the case for execution checks and dead-logic checks, the behavioral-controllability code can be immediately output to the new HDL file, or it can be retained temporarily in data structures in memory, and then output at a later time.

Step 96 is the step of generating code for the table file designated for the particular HDL file being processed. The table file code relates the simulation output containing information about failed or successful behavioral-controllability checks back to particular assignment statements on particular lines of the input HDL file. As was true of other code for table files, the code for behavioral-controllability checks is such that error or warning messages will be output, when the table file is executed, if a certain value if found in a certain element of a character string input to the table file.

Step 98 is the step of generating code, to be inserted into the new HDL file being created, which will cause that HDL file to output ASCII data, such as the contents of the E_chk, T_chk and F_chk character arrays that exist in code example B, at the end of a simulation run. These character strings could later be post-processed to extract information as to which events of interest occurred during a simulation, and which events did not occur during simulation.

Step 99 is the step of outputting binary data that serves the same purpose as the ASCII character strings discussed relative to Step 98. The assumption made in constructing FIG. 7 is that an implementation of the 'flt' invention would want both ASCII and binary data output. This does not need to be the case for the basic concept of the invention to hold. An implementation could output just ASCII, or just binary data. A discussion of possible encodings of data that would facilitate binary output appears later on in this text.

In the preceding discussion of FIG. 7, it was assumed that Step 80 was a loop, in which all assignment statements which occurred in the input HDL file of Step 70 would be examined. When all such statements were examined, Steps 98 and 99 would occur, and the procedure would be exited. It was also assumed that some implementations of the invention would output code to a new HDL file immediately upon generating it, and that some would hold off such outputting until a later time, perhaps for the purpose of outputting the generated code in a different order than it was created.

FIG. 8 illustrates the control flow used by the data processing system of FIG. 2 to perform merging of output data from multiple simulations. The simulations in question would be ones in which the circuit model being simulated consisted of a file, or set of files, that had been processed by the data processing system in the manner indicated in FIG. 7, so that special monitor code for evaluating test coverage had been inserted.

Before discussing the individual steps in the control flow illustrated by FIG. 8, it would be good to discuss the overall goal of the merging operation. Multiple simulations would have been run before this merging operation took place. Each simulation would have deposited a special output file, also called a 'trak_file', which would contain encoded information as to the test coverage attained by that one simulation. These output files, or 'trak_files', could be located in a single location, within a single memory unit, or they could be dispersed across multiple memory units connected by a computer network. The goal of the merging operation is to combine the results of the various simulations into a set of data showing the cumulative effect of all the simulations with respect to test coverage. This means that if only a single simulation 'covers' a particular event, i.e., satisfies a particular type of 'check', be it execution check, dead-logic check or behavioral-controllability check or some other type of check (other types of checks are explored elsewhere in this text), then the cumulative result of all the simulations is deemed to be that check was satisfied. Likewise, if some combination of simulations can be construed to satisfy a given check, then that check is deemed satisfied. As an example of the latter, if one simulation sets an lvalue of a particular assignment statement low, and another simulation sets it high, then the cumulative effect is deemed to be that the lvalue has been set both high and low, and the dead-logic check is deemed satisfied.

It should also be borne in mind when viewing FIG. 8 that for each simulation test case run, output may come from any number of flt-generated HDL files. For example, a model of a particular circuit may be split up into 10 separate HDL files, or 100 separate HDL files. When a simulation of that circuit is run, all 10 or 100 HDL files are simulated, at the same time (simulators, in general, have various means of understanding the interconnections between circuitry modeled in one file and circuitry modeled in another). Since any number of flt-generated HDL files may be simulated by each simulation test case wherein each flt-generated HDL file contains monitor code to estimate test coverage and contains code to output data in which test coverage estimation results are encoded (track_files), each trak_file or output file would contain entries from different HDL files. The present implementation of this invention provides a means of determining which entry in a trak_file comes from which HDL files: the manner for doing this may simply be the printing of the file's name before the actual simulation data, so that each batch of data from each file is preceded by the file's name, in a uniform format.

In the control flow outlined in FIG. 8, it is assumed throughout that the merging discussed above is the merging of ASCII data. A similar control flow holds for the merging of binary data, though some means of effecting the merging, such as the manner in which data are compared, would differ slightly.

Step 100 in FIG. 8 is the reading in of a list of test cases, i.e., names of simulation test cases that have been run. It is assumed that the program reading in the list will have some means of knowing in which memory units the test case results can be found.

Step 102 consists of reading in ASCII data front the output file (trak_file in our terminology) which corresponds to the first test case of the list of simulation test cases read in Step 100. Certain symbols would be recognized to know that a point in the trak_file where a certain type of data can be found. The name of an HDL file from which data is output might be preceded by the ASCII characters "Name:". Or, for example, a capital letter followed by a space might be recognized, such as 'E', to be the beginning point at which a line of ASCII characters can be found that form part of the character string containing encoded data concerning execution checks. The information read in this manner would be deposited in linked lists of data structures in memory, for use later on. The data from the first file read in this manner can be considered to be the 'master' list of data. All data from the next file read will be merged with its data. This will result in a new 'master' version. Then, if other files exist, their data will be read in. Another master version will result, etc..

Step 104 is a test and decision block. If the output from the last of the list of test cases has just been read in, then Step 118 is executed. This step 118 will be discussed later on. If the last of the test case output has not been read in, we go on to Step 106.

Step 106 is the reading in of the next file in the list of trak_files. The file is read in the same manner as the first file was read in Step 102.

Step 108 is as follows: as was explained above, trak_file output files can, and usually do, contain data output from multiple HDL files, and it is necessary to find some symbol, when reading in a trak_file, that denotes the name of the HDL file which output a section of data in a trak_file. Since electrical circuits often have hierarchy, where sub-circuits are instantiated within larger circuits, there may also be stored a hierarchical instance name, which would be different from the file name. There should be some recognizable symbols that would introduce the presence of this name in the trak_file also. This is necessary because sub-circuits can be duplicated inside of larger circuits. For instance, large integrated circuits may have two sub-circuits inside of it to perform integer addition, in order to allow two numbers to be added concurrently. So, Step 108 consists of locating the HDL file name, and its more specific instance name, and then searching the linked list of 'master data' that was first formed in Step 102 to find a datum with the same HDL file name and instance name. This entry in the linked list of 'master data' will contain merged data from all previous simulation output files, or trak_files, processed.

Step 110 is an entry block, denoting entry to a procedure in which the data from the latest trak_file being examined is merged with the data in the master list. All data to be merged is recognized by the use of some special symbols. The example was given above of the special symbol 'E', a capital 'E' followed by a space, to introduce a line of ASCII characters encoding the results of execution checks. Other symbols could be used, but the point is simply that there be some method of recognizing different categories of data to be merged.

Step 112 is the method used for comparing and merging encoded strings denoting the results of execution checks. An execution check is a check to see whether a certain assignment statement was ever executed. If a single simulation test case has executed that assignment statement, the check is considered passed. The symbol for a successful check is a '1'. If the previously merged 'master' data already has a '1' in a particular position of the character string representing execution checks, where every character in the string represents the results of another execution check, then the '1' is left in place (it is not important to store an assignment statement executed more than once). If the previously merged 'master' data has a '0' in a particular position (indicating that the execution statement was not executed in that simulation), and the new data read in has a '1' in that same element of its character string (indicating that the assignment statement was executed subsequent to previous simulations), then the element in the merged data is changed to a '1' (to indicate it was executed some time during simulation). Otherwise, it is left as a '0' (to indicate it was not simulated up to this point in time).

Step 114 illustrates a similar procedure for dead-logic checks. Except in this case, the present implementation of the 'flt' invention allows four possible values for a character encoding the results of a dead-logic check: a 'x' indicates either that the lvalue being monitored by the dead-logic check was never put in a known state, or that the assignment statement of that lvalue was never executed. A '1' means that particular lvalue was set to a true state some time in the simulation, but never to a false state. A '0' means that lvalue was set to a false state, but never to a true state. A '2' means that lvalue was set to both the true and the false states during the simulation and '2' means that the dead-logic check is passing or successful (i.e. both states, logic high and logic low, were attained during simulation). The method for merging data from dead-logic checks is as follows: If the previously merged data already has a '2' in a particular element of the character string for dead-logic checks, that '2' is left in place (the test has been previously set to high and low and is therefore passing/acceptable). If the previously merged data has a '0' and the new data has a '1' or vice versa for a particular position in the character array, then a '2' is placed in that position in the merged data indicated both high and low was achieved for that particular assignment statement in the simulation. Or else, if the previously merged data has an 'x' in that position, and the new data has a value other than 'x', then the value of the new data (either a '1' or a '0') is inserted into that position in the merged data. Otherwise, the merged data is left as it was.

Step 116 illustrates another similar procedure, this time for behavioral-controllability checks. The characters encoding results of behavioral-controllability checks can have any of three values: an 'x' indicates that the body of code for the behavioral-controllability checking was never executed, a '0' indicating that the check was never successfully passed, and a '1' meaning that it was successfully passed. If the previously merged data already has a '1' in a particular location of the character string encoding behavioral-controllability checks, then that '1' is left in place. If the previously merged data has a '0', and the new data has a '1', then the previously merged data is changed to '1'. If the previously merged data has an 'x' value and the new data has any value other than 'x', then the value of the new data is inserted into the previously merged data.

This procedure of merging data is iterated upon, for as long as there are trak_file output files from simulation test cases. Thus, a loop exists between steps 104 and 118. However, when the end of the list of test cases is reached, Step 104 transfers control to Step 118.

Step 118 is the step of sending the character strings that have been stored in the linked list of 'master' data, i.e., the merged data, to executable input files as input arguments, the definition of table files being given above. There is a unique table file in existence for each HDL file simulated, since it is known for which HDL file merged output exists, as this information was noted during Step 108. The correct table file is selected, based on the name of the HDL file, and it is executed with the proper character strings of merged data sent in as input arguments.

Step 120 is the table files printing out warning and error messages. The table files do this by executing programming language statements such as code example 82.

Step 122 is the final step in the process. The merged data is printed to a master data file. At the same time, the data can be examined, and some statistical summary reported. For instance, by counting the occurrences of '1' and '0' characters in the character strings that encode execution checks, it is possible to output a real number indicating the percentage of execution checks which were passed or failed.

Merging of binary encoded data would be handled a bit differently than has been depicted in FIG. 8. Binary merging would be more efficient, in that multiple comparisons could be done with one integer operation, on all the bits packed inside that integer. The following binary encodings could replace the listed ASCII encodings for execution checks, dead-logic checks and behavioral-controllability checks, respectively:

| For execution checks, a one-bit encoding: | |
| --- | --- |
| ASCII | Binary |
| '0' | 0 |
| '1' | 1 |
| For dead-logic checks, a two-bit encoding: | |
| ASCII | Binary |
| 'x' | 00 |
| '0' | 01 |
| '1' | 10 |
| '2' | 11 |
| For behavioral-controllability checks, a two-bit encoding: | |
| ASCII | Binary |
| 'x' | 00 |
| '0' | 01 |
| '1' | 10 |

As can be seen above, logical OR operations on integers packed with such encoded bits would yield pooled results identical to those of the ASCII character comparisons. For example, merging binary-encoded '0' and '1' values for two dead-logic checks would result in the two-bit value 11, which is the code for a '2', indicating (correctly) a successful check. Similarly, binary encodings for 'x', when logically OR'ed with binary encoded bits for non-'x' values automatically take on the non-'x' value, for both dead-logic and behavioral-controllability checks. This is not the only manner which may be used to process data. Other logic operations on differently-encoded binary data may be used to arrive at a "pass" or "no-pass" determination for a specific event in a simulation.

Separate trak_file output files are available for each test case simulated. These trak_files detail the extent to which a particular test case covers events tracked in each HDL file simulated. The task of a test reduction algorithm or program would be to examine these trak_files, and to find a minimal subset of tests such that certain predetermined coverage goals are met. These constraints could be set out more precisely as: x % execution check coverage, y % dead-logic coverage, z % behavioral-controllability coverage, or z % of any other type of check run, and a total run time (in simulation clocks) under t clocks. The task of the program would be to find the subset of tests which gave the greatest coverage percentages, while not exceeding the total clock limit.

The data obtained by the invention, 'flt', can be used to enable an intelligent reduction in a verification test suite, or a fault test suite. For example, an individual may have 100 test vectors which are used to test a part. When applying these 100 test vectors to an integrated circuit designed in accordance with a simulated circuit model, assume that 90% test coverage is attained. It may be the case that 20 of the 100 test may be eliminated and still achieve 90% test coverage due to the fact that the 20 test are redundant to one or more of the other 80 tests (i.e. the 20 tests test nothing in addition to what has or will be tested by the remaining 80 test vectors). Therefore, the 20 tests may be removed without affecting test coverage thus minimizing the test time required to test an integrated circuit (this will improve testing throughput). The elimination of the 20 tests will save several test clock cycles when testing an integrated circuit. Furthermore, 90% coverage may not be needed or wanted by the user. In this case, 'flt' may be used to receive user data such as "we want a set of test vectors with 80% coverage", "we want a set of test vectors that can run in 100 milliseconds", "we want a set of test vectors with 70% to 80% coverage with minimal test time" or "we want a test set that will run in 1 second and have 80% test coverage". In some cases, these conditions cannot be met or are impossible to achieve. In other cases, 'flt' may be used to attempt to find a test set closest to the user's requirements.

Often, it is desired to reduce the total number of simulation cycles that are used to run through a set of test cases to increase test throughput. Or, it is simply desired to reduce the number of test cases while maintaining a certain standard of test coverage as indicated above. In general, choosing an optimal test suite that can meet two requirements simultaneously, that of achieving a certain percentage coverage of specified events, and, second, reducing the number of simulation, or clock cycles to below a certain limit, this can be a computationally intensive problem. The only way to be guaranteed an optimal solution is to examine each possible subset of a given test suite. But, when the test suite is large, and the number of events a user is interested in testing for is also large, than the task is computationally not feasible (it may be too large of a problem for some supercomputers).

A two-pass approach can and should be used for the test suite compaction program. In the first pass, a deterministic approach would be taken to finding a fitting test suite. This would involve deliberately including those tests with the highest coverage numbers, choosing further tests that cover the largest percentage of events left uncovered, etc. Then, on the second pass, an approach that utilizes randomness will be taken (use of a simulated annealing algorithm is one likely possibility). The motivation for the two-pass approach is that if the deterministic first pass fails to find an adequate set, or fails to find a set that is close to optimal, then we need a method that will test out various combinations without repeating previously tried combinations—to attempt to find a suitable, or better, set.

A deterministic algorithm would always produce the same subset of tests, each time it was run. Thus, it needs only to be run once, and then a random algorithm can be used to generate other subsets of test cases, possibly closer to the optimal.

As an example, suppose we ran three tests, and there were 10 events we were interested in tracking. Further, suppose that we formed a matrix, where the rows represented the tests, and the columns represented events during simulation, and a '1' in a column meant that a particular test case was 'covered' that a '0' that it was not 'covered', and suppose we had an eleventh column in the matrix to indicate the simulation clocks for each test case. The matrix might look like this:

|        | 1 | 2 | 3 | 4 | 5 | 6 | 7 | 8 | 9 | 10 | Clk |
|--------|---|---|---|---|---|---|---|---|---|----|-----|
| Test 1 | 0 | 0 | 0 | 0 | 1 | 0 | 0 | 1 | 0 | 0  | 256 |
| Test 2 | 1 | 1 | 1 | 0 | 1 | 1 | 0 | 0 | 1 | 1  | 312 |
| Test 3 | 1 | 1 | 1 | 1 | 1 | 1 | 0 | 0 | 0 | 0  | 435 |

There is a maximum coverage of 90%, if all three tests are used (event seven is not covered by any of the tests). Therefore, if a user asked for 100% coverage given the three tests, the program would determine that this is impossible given the current test vectors. The simulation cycles (clock cycles) to be used are 1003, for the case of using all three tests. The test suite reduction program taught herein would be used to take in requests front the user to; for example "reduce the above test suite to a suite of 2 tests, but still maintaining 90% coverage". Or, "reduce the total simulation time to less than 800 cycles, while maintaining at least 80% coverage". The method for finding which test vectors will suffice (if such conditions can be met) is given above.

In addition to the test coverage checks discussed above, execution, dead-logic and behavioral-controllability checks, there are the following types of checks which could be used in the present invention, 'flt':

Full truth table evaluations. Check whether each possible permutation of values appeared for a given logic expression.

Quiescent node checking. In low-power designs it may be very important that a node not toggle. This check would be successful if an lvalue does not change value.

Full node toggling. The dead-logic check is more severe than the more common toggle test in industry, in that the dead-logic checks 'demands' that each assignment statement set a variable high and low. A full toggle check would only check that some combination of assignments made a particular variable go high and low. Actually, the check would be successful if a pattern of high-low-high or low-high low were seen for a variable, this pattern being able to emerge from the actions of multiple assignment statements, not just a single one.

State Machine transition checking. This type of check is defined down below, where functional coverage models are discussed.

There does not exist a universally accepted model of functional test coverage with respect to an electrical circuit's functionality. In order to arrive at a definition we can associate functional coverage with the tracking of finite state machine transitions. Modern circuit designs can best be understood as implementations of large finite state machines. The ability of a finite state machine to store information about past events, and to change its current behavior on the basis of this stored information, is a characteristic of every non-trivial, large scale circuit design. Unfortunately, the number of states and state transitions in a large circuit (e.g. a modern microprocessor) is astronomical. Simulation of every state transition would be an ideal metric for 'complete' functional coverage, however, it is literally impossible for a million transistor microprocessor (for example). A compromise must be sought.

A sensible compromise is to expect to simulate every state transition of every low-level finite state machine in isolation.

It is possible to break a large state machine (i.e., the entire microprocessor) up into hundreds or thousands of smaller state machines which combine to form the original total state machine. It must be understood that the representation of the entire chip as one, large finite state machine is a representation of a Cartesian product machine. A Cartesian product of two state machines, N and M, having number of states n and m, respectively, is a machine with nm states. Machine N can be in any of its states at the same time as machine M is in any of its states. The state machines that a circuit designer typically designs are usually small (several hundred states or less), and humanly understandable. However, the number of states, and state transitions, quickly escalates when considering the interactions of several finite state machines, i.e., product machines. It is important to ignore this complexity for the purpose of arriving at a functional test coverage metric. Otherwise, it would be impossible to measure functional test coverage on any non-trivial chip design.

The above metric focuses on something measurable, which is isolated state machine activity. For the example machine, N, we would check if it made all possible transitions among its n states—without considering which states machine M, or any other state machine, was in at the time. It should be noted that product machine transitions will be occurring, in any case, during simulation of these transitions—we are just choosing not to view and tabulate them thereby creating a smaller state machine simulation environment which can be exhaustively observed as opposed to attempting to observe the large/entire state machine of the integrated circuit as a whole.

Thus, the check proposed for functional coverage is:

Was every state entered, and every state transition taken, of every low-level finite state machine in the chip, when viewed in isolation?

The definition of a low-level state machine is left open. In practice, it will be the product machine of the greatest complexity representable to the test coverage tool.

The software illustrated herein (such as the elements 21–25 in FIG. 2) are stored on one of either a magnetic media (a disk, a compact disk (CD), a tape, a drum, a ferromagnetic device), electrical storage such as random access memory (RAM), static random access memory (SRAM), fast static random access memory (FSRAM), dynamic random access memory (DRAM), flash devices, read only memory (ROM), electrically programmable read only memory (EPROM), electrically erasable read only memory (EEPROM), ferroelectric memory, or like memory media for binary data, source code, object code, or like computer data. The instructions in a computer program may be viewed as English-type instruction on paper or viewed as physical media such as binary/ASCII values stored in either memory cells or magnetic media.

While the present invention has been shown and described with reference to specific embodiments, further modifications and improvements will occur to those skilled in the art. For example, other simulation events to check for may be conceived and implemented in addition to the ones labeled herein as execution checks, dead-logic checks, behavioral-controllability checks, full truth table evaluations, quiescent node checks, full node toggle checks and state machine transition checking. Different types of circuitry may be simulated, and different simulation methodologies may be used, for example, analog as well as digital simulation. Also, the method taught herein may actually be used for software testing, as opposed to testing of a model of electrical circuitry. Therefore, the method may be adapted to test for certain variable combinations taking on certain values in the execution of a specific software program for a given set of input data, where the input data would correspond to the simulation test cases input to a simulator for electrical circuit models.

Some improvements that can be made for this invention are to incorporate a sophisticated analyzer to discern the state machines and state transition relations inherent in an electrical circuit just by parsing its HDL model description, and then using that information to better plan a series of finite state machine transition checks. Also, another improvement would be to postprocess an output file containing all simulated values of every HDL file variable on every simulation cycle of a simulation run, and by parsing each HDL file search the output trace for evidence of various signal combination being asserted, various variables changing value, etc.. This searching would achieve the same result, i.e., test coverage estimation, without the necessity of inserting new code into the HDL model, and causing it to take longer to execute. In addition, it would eliminate the possibility of errors in the generation of new HDL files causing semantic differences between the new files and the originals. It is to be understood, therefore, that this invention is not limited to the particular forms illustrated and that it is intended in the appended claims to cover all modifications that do not depart from the spirit and scope of this invention.

What is claimed is:

1. A method for estimating test coverage of an original high level language description which represents an electrical circuit, the original high level description having at least one executable assignment statement which models the circuit, the at least one executable assignment statement having a left side and a right side separated by an assignment operator, the left side being a variable, and the right side being an expression which has a set of at least one variable and at least one logic operator, the expression on the right side, when evaluated, determining a value to be assigned to the variable on the left side, the method comprising the steps of:

parsing the original high level language description having at least one executable assignment statement to obtain information of the structure of the electrical circuit represented by the original high level language description; and generating a new high level language description which includes both: (1) new code generated in response to the step of parsing and (2) all the code of the original high level language description necessary for preserving the circuit behavior of the original high level language description;

executing the new high level language description via a central processing unit (CPU) in order to simulate the electrical circuit while providing binary test vectors as input to the simulation of the new high level language description;

storing, via the new code in the new high level language description, data which indicates whether, during the simulation of the new high level language description of the electrical circuit, the set of variables from the right side of the at least one executable assignment statement has been set to predetermined combinations of values to allow an acceptable level of test coverage of the electrical circuit.

2. The method of claim 1 wherein the step of generating further comprises:

using the new code to store data which indicates whether the at least one executable assignment statement has been executed.

3. The method of claim 1 wherein the at least one executable assignment statement comprises a plurality of executable assignment statements and the method further comprising the step of:

storing for each executable assignment statement in the plurality of executable assignment statements whether each assignment statement was executed, the storing being accomplished via the new high level language description.

4. The method of claim 1 wherein the step of generating comprises:

determining the predetermined combinations of gate input values such that all single stuck-at faults on a predetermined gate input of the original high level description will be propagated to a predetermined gate output of the original high level description when the new high level description is if executed with those gate input values.

5. The method of claim 1 wherein the step of generating comprises:

simulating the operation of an electrical circuit by executing the new high level description and inputting input data into the high level description, the electrical circuit being modeled by the new high level description operating on the input data.

6. The method of claim 5 wherein the step of simulating comprises:

storing at least one file of output data which stores results of the step of simulating.

7. The method of claim 5 wherein the step of simulating comprises:

storing multiple files of output data, each file of output data storing results resulting from the step of simulating.

8. The method of claim 5 wherein the step of simulating comprises:

storing a plurality of data vectors, each data vector within the plurality of data vectors identifies which portions of the electrical circuit were accurately tested by a specific test procedure.

9. The method of claim 1 wherein the step of generating comprises:

executing the new high level description using input data patterns creating a output data file which identifies, for each input data pattern, which portions of the new high level description have been accurately tested by each data routine.

10. The method of claim 9 further comprising:

reducing the number of input data patterns needed to test the new high level description using the output data file to determine a desirable reduction.

11. The method of claim 1 wherein the step of generating comprises:

simulating the new high level description using input data patterns;

creating an output data file which identifies, for each input data pattern, the number of clock cycles required by each input data pattern and which portions of the new high level description have been accurately tested by each input data pattern.

12. The method of claim 11 further comprising:

reducing the number of input data patterns needed to test the new high level description by maximizing test coverage of the input data patterns.

13. The method of claim 11 further comprising:

reducing the number of input data patterns needed to test the new high level description by minimizing a total number of clock cycles needed to achieve a predetermined level of test coverage for the new high level description.

14. The method of claim 11 further comprising:

reducing the input data patterns such that an acceptable total number of test clock cycles is achieved along with an acceptable test coverage.

15. The method of claim 1 comprising:

executing the new high level description using input data patterns to gain test coverage information; and using the test coverage information to develop a test procedure for testing the electrical circuit modeled by the new high level description.

16. The method of claim 1 wherein the step of generating comprises:

storing data which identifies whether the left side, which is subject to assignment, is set to both a true and false logic state.

17. The method of claim 1 wherein the step of generating comprises:

storing data which identifies when the left side, which is subject to assignment, completes at least one execution without changing value.

18. The method of claim 1 wherein the step of generating comprises:

storing data which identifies when the left side, which is subject to assignment, completes at least one execution without changing value to ensure that a low-power mode is efficient.

19. The method of claim 1 wherein the step of generating comprises:

storing output information from the simulation of an electrical circuit that implements a state machine wherein the output information may be used to determined if all reachable states in the state machine were entered when the new high level description was executed.

20. The method of claim 1 wherein the step of generating comprises:

storing output information from the simulation of an electrical circuit which implements a state machine wherein the output information may be used to determined if all transitions between states in the state machine were traversed when the new high level description was executed.

21. The method of claim 1 wherein the step of generating comprises:

providing warning or error messages which identify portions of the new high level description that were not tested when a predetermined set of input data patterns was applied to the new high level description during simulation.

22. The method of claim 1 further comprising:

executing the new high level language description to create a plurality of output data files which contain test coverage information; and merging the plurality of output data files into one global data file which is used to obtain test coverage information pertaining to a set of input data patterns applied during simulation of the new high level language description which models the electrical circuit.

23. A data processor for determining the test coverage of an electrical circuit, the data processor comprising:

a memory unit containing an original high level description which models the electrical circuit via a plurality of assignment statements, each assignment statement having a left side and a right side wherein the left side and right side are separated by an assignment operator, the right side containing at least one binary variable;

a bus coupled to the memory unit; and a central processing unit (CPU) coupled to the bus to allow communication between the CPU and the memory unit, the CPU reading the original high level language description from the memory unit and creating a new high level language description containing the plurality of assignment statements and a plurality of new assignment statements inserted among the plurality of assignment statements to store test coverage information in an output file in the memory unit, the CPU determining, based upon simulation of the new high level language description using a set of input binary test data patterns, the test coverage information wherein the test coverage information includes: (1) whether the at least one variable on the right side of each assignment statement in the plurality of assignment statements has been set to a plurality of predetermined values; (2) whether the left side of each assignment statements in the plurality of assignment statements has been set to a predetermined set of values; and (3) whether each of the assignment statements in the plurality of assignments statements has been executed.

24. The data processor of claim 23 wherein the set of input data patterns contain a plurality of data patterns, the output file being analyzed by the CPU to determine which data patterns are redundant and contribute nothing new to test coverage of the electrical circuit.

25. The data processor of claim 24 wherein a subset of input data patterns which are redundant and contribute nothing new to test coverage of the electrical circuit are identified as being data patterns which may be removed from the set of data patterns to form a new set of data patterns, the determining of which data patterns are redundant and contribute nothing new to test coverage of the electrical circuit being performed in a manner which both: (1) reduces the number of clock cycles the new set of data patterns requires to execute in comparison to the set of data patterns; and (2) reduces the number of data patterns residing within the new set of data patterns as compared to the set of data patterns.

26. The data processor of claim 23 wherein the plurality of new assignment statements inserted among the plurality of assignment statements are also used to indicate which left side of the assignments statements in the plurality of assignments statements stay at a single logic value for a predetermined amount of time.

27. The data processor of claim 23 wherein the plurality of new assignment statements inserted among the plurality of assignment statements are also used to indicate which states of a state machine modeled within the original high level language description have been entered during simulation of the new high level language description.

28. The data processor of claim 23 wherein the plurality of new assignment statements inserted among the plurality of assignment statements are also used to indicate which state transitions of a state machine modeled within the original high level language description have been taken during simulation of the new high level language description.

29. A method for determining the test coverage of a plurality of test inputs, the method comprising the steps of:

providing an original high level description model of an electrical circuit, the original high level description model having a plurality of assignments statements each of which have a first portion which is subject to assignment from a second portion wherein the second portion contains variables and logical operators;

parsing the original high level description model to allow for the generation of new assignments statements using information obtained from the parsing;

inserting the new assignments statements into at least a portion of the original high level description model to create a new high level description model;

executing in a simulator the new high level description model wherein some of the new assignments statements in the new high level description model create an output file which contains information regarding: (1) whether the first portion of an assignment statements in the plurality of assignments statement has been transitioned to both a true value and a false value; and (2) whether the second portion of each assignments statements in the plurality of assignments statements has been transitioned to all logical combinations in a predetermined set of combinations; and generating a warning/error message file in response to the output file, the warning/error message file identifying possible voids in test coverage of the electrical circuit.

30. A test estimator for estimating test coverage of an original high level language description of an electrical circuit given a set of test vectors as input, the original high level description having at least one executable assignment statement which models the circuit, the at least one executable assignment statement having a left side and a right side separated by an assignment operator, the left side being a variable, and the right side being an expression which has a set of at least one variable and at least one logic operator, the expression on the right side, when evaluated, determining a value to be assigned to the variable on the left side, the test estimator comprising:

means for parsing the original high level language description to obtain information of the general structure of the high level language description and information of the structure of the at least one executable assignment statement; and means for generating a new high level language description which includes new generated code and all the code of the original high level language description necessary for preserving a circuit behavior of the original high level description, the means for generating creating the new high level language description in response to the information obtained by the means for parsing, the new generated code being generated by the means for generating to store data which indicates whether, during the simulation of the new high level language description of the circuit, the set of variables from the right side of the at least one executable assignment statement has been set to predetermined combinations of values in response to a plurality of binary test vectors applied as input to various input terminals which are simulated as being part of the electrical circuit modeled by the new high level language description.

31. A test estimator for determining the test coverage of a plurality of test input vectors, the test estimator comprising:

means for accessing a high level description model of an electrical circuit, the high level description model having a plurality of assignments statements each of which have a first portion which is subject to assignment from a second portion wherein the second portion contains variables and logical operators;

means for parsing the high level description model to allow for the generation of new assignments statements by using information obtained by the parsing;

means for inserting the new assignments statements into the high level description model to create a new high level description model;

means for executing the new high level description model wherein some of the new assignments statements in the new high level description model create an output file which contains information regarding: (1) whether the first portion of an assignment statements in the plurality of assignments statement has been transitioned to both a true value and a false value; and (2) whether the second portion of each assignments statements in the plurality of assignments statements has been transitioned to all logical combinations in a predetermined set of binary combinations; and means for generating a warning/error message file in response to the output file, the warning/error message file identifying possible voids in test coverage of the electrical circuit.

32. A method for determining test coverage, the method comprising the steps of:

providing a plurality of test vectors where each test vector in the plurality of test vectors contains a plurality of binary values which, when applied to an integrated circuit, test at least a portion of the integrated circuit to ascertain whether the at least a portion of the integrated circuit is operating properly;

providing a plurality of simulation instructions wherein the plurality of simulation instructions, when executed, simulate an operation of the integrated circuit, each simulation instruction in the plurality of simulation instructions having an assignment portion and a calculation portion wherein the calculation portion is processed, when executed, to assign a binary value to the assignment portion, the plurality of simulation instructions simulating input terminals of an external portion of the integrated circuit;

parsing the plurality of simulation instructions to form parsed information;

processing the parsed information to determine which test instructions need to be inserted into the plurality of simulation instructions;

inserting the test instructions into the plurality of simulation instructions;

executing the plurality of instructions, which includes the test instructions, using the test vectors as input to the simulated input terminals within the plurality of instructions;

storing test data while executing via the test instructions; and using the test data to determine the test coverage of the test vectors.

33. A method for determining transitions in an electrical circuit simulation of an electrical circuit, the method comprising the steps of:

providing a plurality of test vectors containing a plurality of binary values which are used to test the functionality of the electrical circuit;

providing a plurality of instructions which are used to model the operation of the electrical circuit via binary assignment statements which simulate logic gates;

parsing the binary assignment statements to obtain assignment information;

using the assignment information to insert a set of proper test instructions among the binary assignment statements;

executing the binary assignment statements, which include the test instructions, while providing the plurality of test vectors to the binary assignments statements, wherein the test instructions monitor binary switching in the binary assignment statements and record switching data to storage media, the binary switching simulating the electrical circuit; and accessing the storage media to evaluate the switching data to determine an extent of test coverage of the electrical circuit when using the plurality of test vectors.

34. The method of claim 33 wherein the step of accessing comprises:

altering the plurality of test vectors in order to improve the test coverage of the plurality of test vectors when the plurality of test vectors are used to test the electrical circuits which are manufactured.

35. The method of claim 33 further comprising the steps of:

manufacturing a plurality of integrated circuits which contain the electrical circuit;

testing each integrated circuit in the plurality of integrated circuits using the plurality of test vectors.

36. A method for determining whether binary test vectors applied to a software model of an electrical circuit cause a propagation of a single stuck-at fault from an input of a modeled logic gate to an output of the modeled logic gate wherein the software model models the modeled logic gate, the method comprising the steps of:

providing the binary test vectors containing a plurality of binary values which are used to test the functionality of the electrical circuit;

providing a plurality of instructions which are used to simulate the electrical circuit and the modeled logic gates via binary assignment statements which simulate logic gates;

parsing the binary assignment statements to obtain assignment information, the assignment information being used to determine predetermined combinations of gate input values such that all single stuck-at faults on a predetermined gate input of the modeled logic gates will be propagated to a predetermined gate output of the modeled logic gates when the modeled logic gates are simulated with these gate input values;

using the assignment information to insert a set of test instructions among the binary assignment statements, the set of test instructions being used to monitor the propagation of the single stuck-at fault from the input of the modeled logic gate to the output of the modeled logic gate;

executing the binary assignment statements, which include the test instructions, while providing the binary test vectors as input, wherein the test instructions monitor the propagation of the single stuck-at fault from the input of the modeled logic gate to the output of the modeled logic gate; and determining the extent to which binary test vectors applied to the software model of the electrical circuit cause the propagation of the single stuck-at fault from the input of the modeled logic gate to the output of the modeled logic gate wherein the software model models the modeled logic gate.

* * * * *